(12) United States Patent
Takeuchi

(10) Patent No.: US 6,737,718 B2
(45) Date of Patent: May 18, 2004

(54) SEMICONDUCTOR PHOTODETECTOR

(75) Inventor: Takeshi Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/984,571

(22) Filed: Oct. 30, 2001

(65) Prior Publication Data

US 2002/0050622 A1 May 2, 2002

(30) Foreign Application Priority Data

Oct. 30, 2000 (JP) ........................................ 2000-329833
Nov. 27, 2000 (JP) ........................................ 2000-358691

(51) Int. Cl.⁷ ...................... H01L 27/14; H01L 31/0352
(52) U.S. Cl. ...................... 257/431; 257/459; 257/466; 257/436
(58) Field of Search ................................ 257/436, 459, 257/466, 431

(56) References Cited

U.S. PATENT DOCUMENTS 5,357,122 A * 10/1994 Okubora et al. ............... 257/84

FOREIGN PATENT DOCUMENTS

| JP | A 1-296663 | 11/1989 |
|---|---|---|
| JP | 3-225320 | 10/1991 |
| JP | 5-121774 | 5/1993 |
| JP | A 5-183185 | 7/1993 |
| JP | B2 2605911 | 2/1997 |
| JP | A 10-209484 | 8/1998 |
| JP | A 11-87758 | 3/1999 |
| JP | A 11-87759 | 3/1999 |
| JP | A 11-112017 | 4/1999 |
| JP | 11-261100 | 9/1999 |
| JP | A 2000-294882 | 10/2000 |

OTHER PUBLICATIONS

T. Takeuchi et al., "A High–Efficiency Waveguide Photodiode for 40–Gb/s Optical Receivers," Third Optoelectronics and Communications Conference Technical Digest, 1998, Makuhari Messe, pp. 354–355.

Fall 1999; 60th Applied Physical Science 3rd Volume Compilation of Academic Presentations; . 985, 1p–ZC–8 Wave conduction path PD: "Study of resistance to high light input/incidental terminal surface high reliability construction".

* cited by examiner

Primary Examiner—Jerome Jackson
(74) Attorney, Agent, or Firm—Young & Thompson

(57) ABSTRACT

A semiconductor device includes: a waveguide mesa structure including at least an optical absorption layer for photoelectric conversion; and a heat radiation semiconductor layer in contact directly with at least a part of the optical absorption layer for heat radiation from the optical absorption layer, and the heat radiation semiconductor layer being lower in refractive index and larger in energy band gap than the optical absorption layer.

26 Claims, 16 Drawing Sheets

Incident light

Incident light

SEMICONDUCTOR PHOTODETECTOR

BACKGROUND OF THE INVENTION

1. Field of the Invention

The present invention relates to a semiconductor photodetector, and more particularly to a waveguide semiconductor photodetector to be used for a light receiving module or a light transmitting module in an optical communication system.

2. Description of the Related Art

Research and development to the waveguide semiconductor photodetector have been progressed (or a light receiving module or a light transmitting module in an optical communication system. The waveguide semiconductor photodetector has an optical absorption layer. A light is incident in parallel to a surface of the optical absorption layer. Even if the optical absorption layer is designed to be thin for obtaining high speed performances, then a sufficiently long waveguide length of the optical absorption layer ensures a high photoelectric conversion efficiency. The waveguide semiconductor photodetector may be designed for obtaining both a high speed response due to a shortened carrier traveling time and a high photoelectric conversion efficiency.

One of the conventional waveguide semiconductor photodetector is disclosed in Third Optoelectronics And Communications Conference Technical Digest, July 1998, pp. 354–355. FIG. 1 is a fragmentary cross sectional elevation view illustrative of a conventional waveguide semiconductor photodetector.

An n+–InP cladding layer 102 overlies a semi-insulating InP substrate 101. An n+–InAlGaAs optical guide layer 103 overlies on a selected region of the n+–InP cladding layer 102. The n+–InAlGaAs optical guide layer 103 has a thickness of 0.8 micrometers, and also has a refractive index which is an intermediate level between a core layer and a cladding layer. An i-InGaAs optical absorption layer 104 overlies the n+–InAlGaAs optical guide layer 103. The i-InGaAs optical absorption layer 104 has a thickness of 0.5 micrometers. A p+–InAlGaAs optical guide layer 105 overlies the i-InGaAs optical absorption layer 104. The p+–InAlGaAs optical guide layer 105 has a thickness of 0.1 micrometer. A p+–InP cladding layer 106 overlies the p+–InAlGaAs optical guide layer 105. A p+–InGaAs contact layer 107 overlies the p+–InP cladding layer 106. The lamination of the n+–InAlGaAs optical guide layer 103, the i-InGaAs optical absorption layer 104, the p+–InAlGaAs optical guide layer 105, the p+–InP cladding layer 106 and the p+–InGaAs contact layer 107 forms a waveguide mesa structure.

A silicon nitride film 108 extends over the n+–InP cladding layer 102 and also on side walls and a top of the waveguide mesa structure. The silicon nitride film 108 has a first opening over the p+–InGaAs contact layer 107, and second and third openings over the n+–InP cladding layer 102. N-electrodes 110 are provided in the second and third openings over the n+–InP cladding layer 102. A p-electrode 109 is provided in the first opening over the p+–InGaAs contact layer 107.

The n-electrodes 110 are provided in contact with the n+–InP cladding layer 102 relatively near the waveguide mesa structure so as to reduce a parasitic resistance. The i-InGaAs optical absorption layer 104 is designed to be thin, for example, at 0.5 micrometers in order to obtain a high speed response with a cut-off frequency of not less than 40 GHz at 3 dB-down. The waveguide structure ensures a high photoelectric conversion efficiency at 77%.

The above-described conventional waveguide semiconductor photodetector may reduce, a device resistance. The waveguide mesa structure is directly coated with a thin silicon nitride film, whereby a heat radiation characteristic is poor. An incidence of a high power light into the device is likely to result in an undesirable heat accumulation which may deteriorate or break the waveguide semiconductor photodetector.

In the above circumstances, the development of a novel waveguide semiconductor photodetector free from the above problems is desirable.

SUMMARY OF THE INVENTION

Accordingly, it is an object of the present invention to provide a novel waveguide semiconductor photodetector free from the above problems.

It is a further object of the present invention to provide a novel waveguide semiconductor photodetector with a reduced device resistance, a high performance and a high reliability to a heat generation due to an incidence of a high power light without deterioration and break-down.

The present invention provides a semiconductor device including: a waveguide mesa structure including at least an optical absorption layer for photoelectric conversion; and a heat radiation semiconductor layer in contact directly with at least a part of the optical absorption layer for heat radiation from the optical absorption layer, and the heat radiation semiconductor layer being lower in refractive index and larger in energy band gap than the optical absorption layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
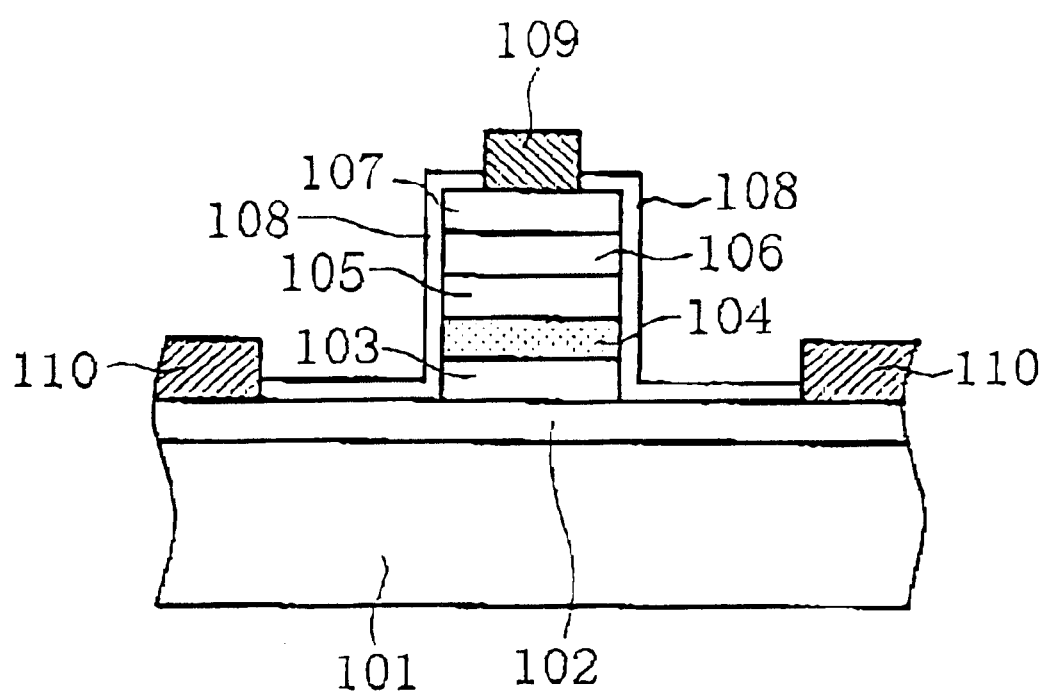
FIG. 1 is a fragmentary cross sectional elevation view illustrative of a conventional waveguide semiconductor photodetector.

A first aspect of the present invention is a semiconductor device including: a waveguide mesa structure including at least an optical absorption layer for photoelectric conversion; and a heat radiation semiconductor layer in contact directly with at least a part of the optical absorption layer for heat radiation from the optical absorption layer, and the heat radiation semiconductor layer being lower in refractive index and larger in energy band gap than the optical absorption layer It is preferable that the optical absorption layer is at least partially surrounded by and in contact directly with the heat radiation semiconductor layer.

It is preferable that the optical absorption layer is omnidirectionally surrounded by the heat radiation semiconductor layer.

It is preferable that the waveguide mesa structure is at least partially surrounded by and in contact directly with the heat radiation semiconductor layer.

It is preferable that the waveguide mesa structure is omnidirectionally surrounded by the heat radiation semiconductor layer.

It is preferable that the heat radiation semiconductor layer is so thick that the waveguide mesa structure is buried in the heat radiation semiconductor layer.

It is preferable that the heat radiation semiconductor layer has a top surface which is almost the same level as a top of the waveguide mesa structure.

It is preferable that the heat radiation semiconductor layer has a first groove which is positioned in a back-side of the waveguide mesa structure, and the back-side is opposite to a front side, from which a light is incident into the waveguide mesa structure, and the first groove acting as a back-side reflective mirror for reflecting a light to the waveguide mesa structure.

It is preferable that the first groove is separated from a back-side face of the waveguide mesa structure by a part of the heat radiation semiconductor layer.

It is preferable that the first groove is adjacent to a back-side face of the waveguide mesa structure.

It is preferable to further comprise: at least a first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light.

It is preferable that the heat radiation semiconductor layer has a second groove which is positioned in the first side of the waveguide mesa structure, and the second groove reaches a first contact part of a bottom cladding layer extending from the lower region of the waveguide mesa structure, and the first contact part of the bottom cladding layer is positioned close to the waveguide mesa structure.

It is preferable that the second groove is separated from the waveguide mesa structure by a part of the heat radiation semiconductor layer.

It is preferable that in the incident direction of the incident light, the second groove extends in almost the same extent as an entirety of the waveguide mesa structure.

It is preferable that in the incident direction of the incident light, the second groove is retreated from the front side and extends in a smaller extent than an entirety of the waveguide mesa structure.

It is preferable to further comprise: a first-side first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light; and a second-side first-polarity electrode structure which is electrically connected to the lower region than the optical absorption layer of the waveguide mesa structure from a second side of the waveguide mesa structure.

It is preferable that the heat radiation semiconductor layer has second and third grooves, and the second groove is positioned in the first side of the waveguide mesa structure, and the third groove is positioned in the second side of the waveguide mesa structure, and the second groove reaches a first contact part of a bottom cladding layer extending from the lower region of the waveguide mesa structure, and the third groove reaches a second contact part of the bottom cladding layer extending from the lower region of the waveguide mesa structure, and the first and second contact parts of the bottom cladding layer are positioned close to the waveguide mesa structure.

It is preferable that the second and third grooves are separated from the waveguide mesa structure by parts of the heat radiation semiconductor layer.

It is preferable that in the incident direction of the incident light, the second and third grooves extend in almost the same extent as an entirety of the waveguide mesa structure.

It is preferable that in the incident direction of the incident light, the second and third grooves are retreated from the front side and extend in a smaller extent than an entirety of the waveguide mesa structure.

It is preferable that the heat radiation semiconductor layer is so thin that the waveguide mesa structure is coated with the heat radiation semiconductor layer.

It is preferable to further comprise: at least a first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light.

It is preferable to further comprise: a first-side first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light; and a second-side first-polarity electrode structure which is electrically connected to the lower region than the optical absorption layer of the waveguide mesa structure from a second side of the waveguide mesa structure.

It is preferable to further comprise: a second-polarity electrode structure which is electrically connected to an upper region than the optical absorption layer of the waveguide mesa structure from a top of the waveguide mesa structure, and the second-polarity electrode structure including a heat radiator.

It is preferable that the heat radiator comprises a thick electrode layer made of a high heat conductivity.

It is preferable that the optical absorption layer receives a direct incidence of a light.

It is preferable that the waveguide mesa structure includes an optical guide region adjacent to the optical absorption layer, and the optical guide region receives a direct incidence of a light, so that the light is indirectly incident to the optical absorption layer through the optical guide region.

It is preferable that the optical guide region has a uniform refractive index and a uniform wavelength composition It is preferable that the optical guide region increases in refractive index uniform and wavelength composition toward the optical absorption layer.

It is preferable that the optical guide region comprises plural layers, and a closer one of the plural layers to the optical absorption layer is highest in refractive index uniform aid wavelength composition.

It is preferable that the heat radiation semiconductor layer comprises an Fc-doped InP layer.

A second aspect of the present invention is a semiconductor photodetector including: a substrate; a waveguide mesa structure provided on a selected region of the substrate, and the waveguide mesa structure including at least an optical absorption layer for photoelectric conversion; and a heat radiation semiconductor layer being provided on other region of the substrate and being so thick that the waveguide mesa structure is buried in the heat radiation semiconductor layer, and the waveguide mesa structure is at least partially surrounded by and in contact directly with the at least a part of the optical absorption layer for heat radiation from the heat radiation semiconductor layer, and the heat radiation semiconductor layer being lower in refractive index and larger in energy band gap than the optical absorption layer.

It is preferable that the waveguide mesa structure is omnidirectionally surrounded by the heat radiation semiconductor layer.

It is preferable that the heat radiation semiconductor layer has a top surface which is almost the same level as a top of the waveguide mesa structure.

It is preferable that the heat radiation semiconductor layer has a first groove which is positioned in a back-side of the waveguide mesa structure, and the back-side is opposite to a front side, from which a light is incident into the waveguide mesa structure, and the first groove acting as a back-side reflective mirror for reflecting a light to the waveguide mesa structure.

It is preferable that the first groove is separated from a back-side face of the waveguide mesa structure by a part of the heat radiation semiconductor layer.

It is preferable that the first groove is adjacent to a back-side face of the waveguide mesa structure.

It is preferable to further comprise at: least a first-polarity electrode, structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light.

It is preferable that the heat radiation semiconductor layer has a second groove which is positioned in the first side of the waveguide mesa structure, and the second groove reaches a first contact part of a bottom cladding layer extending from the lower region of the waveguide mesa structure, and the first contact part of the bottom cladding layer is positioned close to the waveguide mesa structure.

It is preferable that the second groove is separated from the waveguide mesa structure by a part of the heat radiation semiconductor layer.

It is preferable that in the incident direction of the incident light, the second groove extends in almost the same extent as an entirety of the waveguide mesa structure.

It is preferable that in the incident direction of the incident light, the second groove is retreated from the front side and extends in a smaller extent than an entirety of the waveguide mesa structure.

It is preferable to further comprise: a first-side first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light; and a second-side first-polarity electrode structure which is electrically connected to the lower region than the optical absorption layer of the waveguide mesa structure from a second side of the waveguide mesa structure.

It is preferable that the heat radiation semiconductor layer has second and third grooves, and the second groove is positioned in the first side of the waveguide mesa structure, and the third groove is positioned in the second side of the waveguide mesa structure, and the second groove reaches a first contact part of a bottom cladding layer extending from the lower region of the waveguide mesa structure, and the third groove reaches a second contact part of the bottom cladding layer extending from the lower region of the waveguide mesa structure, and the first and second contact parts of the bottom cladding layer are positioned close to the waveguide mesa structure.

It is preferable that the second and third grooves are separated from the waveguide mesa structure by parts of the heat radiation semiconductor layer.

It is preferable that in the incident direction of the incident light, the second and third grooves extend in almost the same extent as an entirety of the waveguide mesa structure.

It is preferable that in the incident direction of the incident light, the second and third grooves are retreated from the front side and extend in a smaller extent than an entirety of the waveguide mesa structure It is preferable to further comprise: a second-polarity electrode structure which is electrically connected to an upper region than the optical absorption layer of the waveguide mesa structure from a top of the waveguide mesa structure, and the second-polarity electrode structure including a heat radiator.

It is preferable that the heat radiator comprises a thick electrode layer made of a high heat conductivity.

It is preferable that the optical absorption layer receives a direct incidence of a light.

It is preferable that the waveguide mesa structure includes an optical guide region adjacent to the optical absorption layer, and the optical guide region receives a direct incidence of a light, so that the light is indirectly incident to the optical absorption layer through the optical guide region.

It is preferable that the optical guide region has a uniform refractive index and a uniform wavelength composition.

It is preferable that the optical guide region increases in refractive index uniform and wavelength composition toward the optical absorption layer.

It is preferable that the optical guide region comprises plural layers, and a closer one of the plural layers to the optical absorption layer is highest in refractive index uniform and wavelength composition.

It is preferable that the heat radiation semiconductor layer comprises an Fe-doped InP layer.

A third aspect of the present invention is a semiconductor photodetector including; a substrate; a waveguide mesa structure provided on a selected region of the substrate, and the waveguide mesa structure including at least an optical absorption layer for photoelectric conversion and a heat radiation semiconductor layer being provided on other region of the substrate and being so thin that the waveguide mesa structure is coated with the heat radiation semiconductor layer, and the waveguide mesa structure is at least partially surrounded by and in contact directly with the at least a part of the optical absorption layer for heat radiation from the heat radiation semiconductor layer, and the heat radiation semiconductor layer being lower in refractive index and larger in energy band gap than the optical absorption layer.

It is preferable to further comprise: at least a first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to in incident direction of an incident light.

It is preferable to further comprise: a first-side first-polarity electrode structure which is electrically connected to a lower region than the optical absorption layer of the waveguide mesa structure from a first side of the waveguide mesa structure, and the first side being opposite to a second side, and the first and second sides being distanced in a direction perpendicular to an incident direction of an incident light; and a second-side first-polarity electrode structure which is electrically connected to the lower region than the optical absorption layer of the waveguide mesa structure from a second side of the waveguide mesa structure.

It is preferable to further comprise: a second-polarity electrode structure which is electrically connected to an upper region than the optical absorption layer of the waveguide mesa structure from a top of the waveguide mesa structure, and the second-polarity electrode structure including a heat radiator.

It is preferable that the heat radiator comprises a thick electrode layer made of a high heat conductivity.

It is preferable that the optical absorption layer receives a direct incidence of a light.

It is preferable that the waveguide mesa structure includes an optical guide region adjacent to the optical absorption layer, and the optical guide region receives a direct incidence of a light, so that the light is indirectly incident to the optical absorption layer through the optical guide region.

It is preferable that the optical guide region has a uniform refractive index and a uniform wavelength composition.

It is preferable that the optical guide region increases in refractive index uniform and wavelength composition toward the optical absorption layer.

It is preferable that the optical guide region comprises plural layers, and a closer one of the plural layers to the optical absorption layer is highest in refractive index uniform and wavelength composition.

It is preferable that the heat radiation semiconductor layer comprises an Fc-doped InP layer.

First Embodiment

Figure 2:
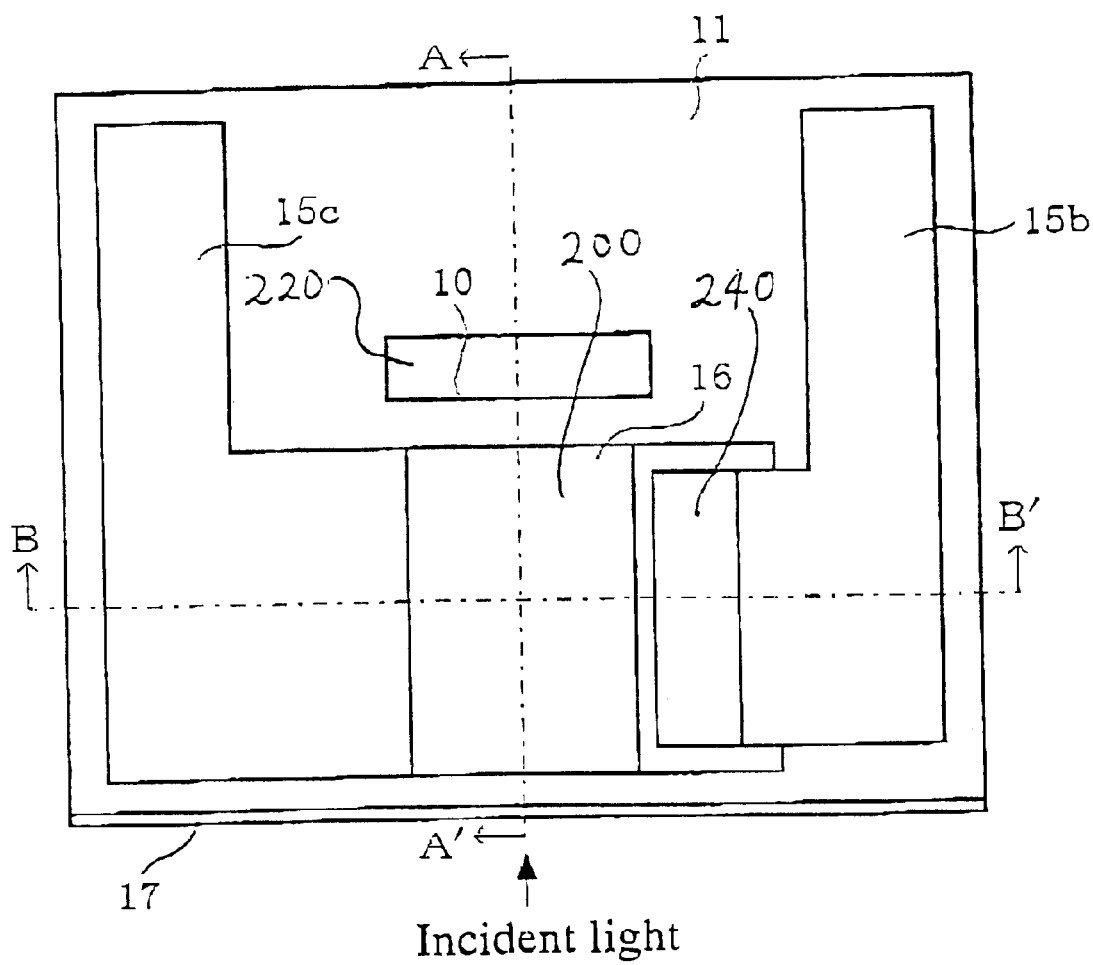
FIG. 2 is a plan view illustrative of a novel waveguide semiconductor photodetector in a first embodiment in accordance with the present invention.
Figure 3:
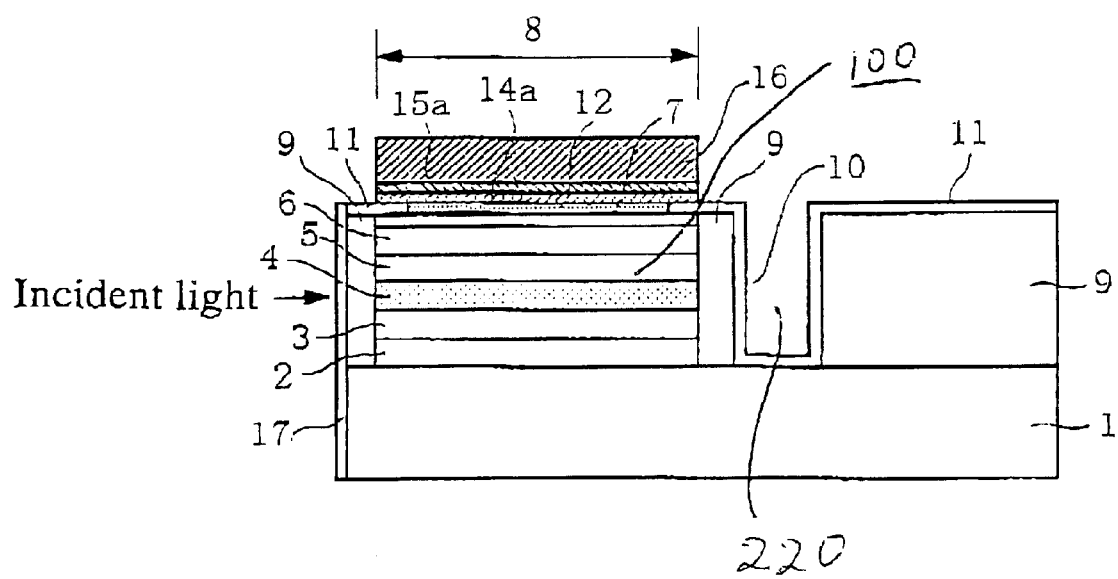
FIG. 3 is a cross sectional elevation view illustrative of a novel waveguide semiconductor photodetector, taken along an A–A' line of FIG. 2.
Figure 4:
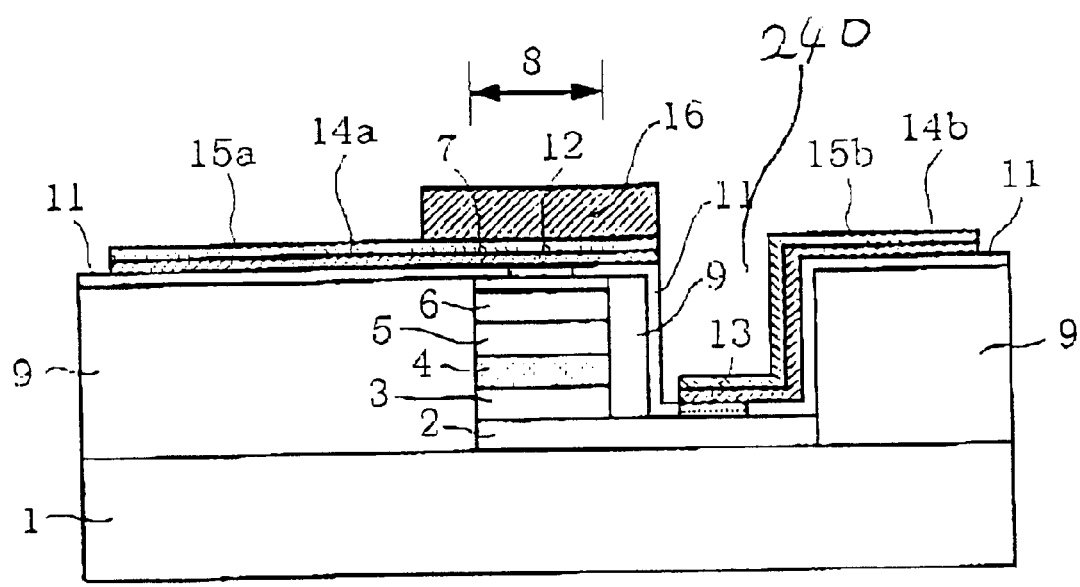
FIG. 4 is a cross sectional elevation view illustrative of a novel waveguide semiconductor photodetector, taken along a B–B' line of FIG. 2.

A first embodiment according to the present invention will be described in detail with reference to the drawings. FIG. 2 is a plan view illustrative of a novel waveguide semiconductor photodetector in a first embodiment in accordance with the present invention. FIG. 3 is a cross sectional elevation view illustrative of a novel waveguide semiconductor photodetector, taken along an A–A' line of FIG. 2. FIG. 4 is a cross sectional elevation view illustrative of a novel waveguide semiconductor photodetector, taken along a B–B' line of FIG. 2.

A waveguide semiconductor photodetector includes a semi-insulating semiconductor substrate 1 and a heat radiation semiconductor layer 9 over the insulating substrate. A waveguide mesa structure 100 defines a photo-electric conversion region 8. The waveguide mesa structure 100 is buried in the heat radiation semiconductor layer 9, so that the waveguide mesa structure 100 is surrounded by and in contact with the heat radiation semiconductor layer 9. The waveguide mesa structure 100 extends on a waveguide mesa structure region 200. The waveguide mesa structure region 200 extends adjacent to a front side of the waveguide semiconductor photodetector, wherein a light is incident from the front side to the waveguide mesa structure 100. The direction of the incidence of the light is vertical to the front side face. An optical axis of the incident light is vertical to the front side face.

The heat radiation semiconductor layer 9 has a first groove 220 and a second groove 240. The first groove 220 is positioned in back-side of the waveguide mesa structure 100. The first groove 220 is distanced from a back-side face of the waveguide mesa structure 100, so that the first groove 220 is isolated from the back-side face of the waveguide mesa structure 100 by a part of the heat radiation semiconductor layer 9.

The second groove 240 is positioned in the first-side of the waveguide mesa structure 100. The second groove 240 is distanced from a first-side face of the waveguide mesa structure 100, so that the second groove 240 is isolated from the first-side face of the waveguide mesa structure 100 by a part of the heat radiation semiconductor layer 9.

The bottom face of the waveguide means structure 100 is in contact with the semi-insulating semiconductor substrate 1. The front and back faces and first and second faces of the waveguide mesa structure 100 are in contact with or coated with the heat radiation semiconductor layer 9. The top surface of the waveguide mesa structure 100 is in contact with a multi-layer electrode structure which includes a heat radiative electrode 16.

The heat radiation semiconductor layer 9 has a high heat conductivity for acting as the heat radiator, wherein a heat generated in the waveguide mesa structure 100 is radiated to the heat radiation semiconductor layer 9. The heat radiative electrode 16 also has a high heat conductivity for acting as the heat radiator, wherein a heat generated in the waveguide mesa structure 100 is radiated to the heat radiative electrode 16.

Namely, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100.

The heat radiation semiconductor layer 9 may, for example, comprise an Fe-doped InP layer which is extremely higher in heat conductivity than silicon nitride and atmosphere. Needless to say, the heat radiation semiconductor layer 9 may be made of other materials which are much higher in heat conductivity than the silicon nitride and atmosphere.

The surface of the heat radiation semiconductor layer 9 is coated with a silicon nitride layer 11 except on the front face thereof, so that the side walls and a bottom of the first groove 220 as well as the side walls and a bottom of the second groove 240 are also coated with the silicon nitride layer 11.

The first groove 220 has a first depth which reaches the upper surface of the semi-insulating semiconductor substrate 1, so that the first groove 220 provides a back-side reflective mirror 10 to the waveguide mesa structure 100 for reflecting the light to the waveguide mesa structure 100. A closer side wall of the first groove 220 to the back-side face of the waveguide mesa structure 100 serves as a reflecting mirror. An anti-reflective film 17 is also provided on the front face of the waveguide semiconductor photodetector for allowing the incidence of the light into the waveguide mesa structure 100.

The second groove 240 has a second depth which reaches an upper surface of a bottom layer of the waveguide mesa structure 100. The silicon nitride layer 11 has a first opening on a part of the bottom of the second groove 240. A first polarity electrode structure is provided which extends from the bottom of the second groove 240 through the side wall of the second groove 240 over the top surface of the heat radiation semiconductor layer 9, so that the first polarity electrode structure is electrically connected through the first opening to the bottom layer, for example, a first type conductivity cladding layer of the waveguide mesa structure 100.

The first polarity electrode structure is thus electrically connected directly to the first type conductivity cladding layer of the waveguide mesa structure 100 at a closer position to the first side of the waveguide mesa structure 100, thereby obtaining an effective reduction to the parasitic resistance of the waveguide mesa structure 100. The first polarity electrode structure extend in the first side region of the waveguide mesa structure 100.

The silicon nitride layer 11 also has a second opening which is positioned over the top surface of the waveguide mesa structure 100. A second polarity electrode structure is provided over the waveguide mesa structure 100. The second polarity electrode structure is electrically connected through the second opening to the top layer of second conductivity type of the waveguide mesa structure 100. The second polarity electrode structure extends in the second side region of the waveguide mesa structure 100, so that the second polarity electrode structure is distanced from the first polarity electrode structure.

The waveguide mesa structure 100 may be designed to adjust the waveguide length and the thickness of the optical absorption layer for obtaining both desirable high speed performances and high photoelectric conversion efficiency.

The first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

The second groove 240 is provided in the first side of the waveguide mesa structure 100 and is separated from but close to the first-side face of the waveguide mesa structure 100, so as to provide an electrical connection between the first polarity electrode structure to the first conductivity type region of the waveguide mesa structure 100 for effective reduction to the waveguide semiconductor photodetector.

The waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and breakdown.

The above-described respective structural elements for the novel waveguide semiconductor photodetector may be realized as follows as one preferable examples.

The semi-insulating semiconductor substrate 1 may optically be made of InP. Various structures are available for the waveguide mesa structure 100. One preferable multi-layered waveguide mesa structures available would be as follows.

An n+–InP cladding layer 2 overlies a selected region of the semi-insulating InP substrate 1. An n+–InAlGaAs optical guide layer 3 overlies a selected region of the n+–InP cladding layer 2 The n+–InAlGaAs optical guide layer 3 has a wavelength composition of 1.3 micrometers. An i-InGaAs optical absorption layer 4 overlies the n+–InAlGaAs optical guide layer 3. The i-InGaAs optical absorption layer 4 has a thickness of 0.5 micrometers. A p+–InAlGaAs optical guide layer 5 overlies the i-InGaAs optical absorption layer 4. The p+–InAlGaAs optical guide layer 5 has a wavelength composition of 1.3 micrometers. A p+–InP cladding layer 6 overlies the p+–InAlGaAs optical guide layer 5. A p+–InGaAs contact layer 7 overlies the p+–InP cladding layer 6. The lamination of the n+–InAlGaAs optical guide layer 3, the i-InGaAs optical absorption layer 4, the p+–InAlGaAs optical guide layer 5, the p+–InP cladding layer 6 and the p+–InGaAs contact layer 7 forms the waveguide mesa structure 100.

The above-described first conductivity type bottom layer corresponds to the n+−InP cladding layer 2. The above-described photoelectric conversion region 8 may be, for example, 20 micrometers in size.

The above-described first polarity electrode structure comprises an AuGeNi alloy electrode 13, a TiPtAu electrode 14b and an Au-plated electrode 15b. The AuGeNi alloy electrode 13 is provided in the first opening of the silicon nitride layer 11 so that the AuGeNi alloy electrode 13 is in contact with a part of the upper surface of the n+−InP cladding layer 2. The TiPtAu electrode 14b is in contact with the AuGeNi alloy electrode 13 and with the silicon nitride layer 11, so that the TiPtAu electrode 14b extends from the bottom of the second groove 240 along the side wall thereof and over the heat radiation semiconductor layer 9 on the first side region of the waveguide mesa structure 100. The Au-plated electrode 15b is laminated on the TiPtAu electrode 14b.

The above-described second polarity electrode structure comprises an AuZn alloy electrode 12, a TiPtAu electrode 14a and an Au-plated electrode 15a as well as a heat radiative electrode 16. The AuZn alloy electrode 12 is provided in the second opening of the silicon nitride layer 11 so that the AuZn alloy electrode 12 is in contact with the p+−InGaAs contact layer 7. The TiPtAu electrode 14a is in contact with the AuZn alloy electrode 12 and with the silicon nitride layer 11, so that the TiPtAu electrode 14b extends over the heat radiation semiconductor layer 9 on the second side region of the waveguide mesa structure 100. The Au-plated electrode 15a is laminated on the TiPtAu electrode 14a. The heat radiative electrode 16 is selectively provided on the Au-plated electrode 15a. The heat radiative electrode 16 may comprise an Au-plated layer having a thickness of 5 micrometers. Au has a high heat conductivity. Other electrically conductive and highly heat conductive material such as Cu may also be available for the heat radiative electrode 16.

The above-described antireflective layer 17 may comprise a silicon nitride film 17.

As described above, the waveguide semiconductor photodetector of this embodiment may provide the following effects and advantages.

First, the waveguide mesa structure 100 may be designed to adjust the waveguide length and the thickness of the optical absorption layer for obtaining both desirable high speed performances and high photoelectric conversion efficiency.

Second, the first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side relective mirror 10 to the optical absorption layer 4, wherein the reflected light may be absorbed into the optical absorption layer 4. As a result, the photoelectric conversion efficiency is increased.

Third, the second groove 240 is provided in the first side of the waveguide mesa structure 100 and is separated from but close to the first-side face of the waveguide mesa structure 100, so as to provide an electrical connection between the first polarity electrode structure to the first conductivity type legion of the waveguide mesa structure 100 for effective reduction to the waveguide semiconductor photodetector.

Fourth, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and break-down.

Second Embodiment

Figure 5:
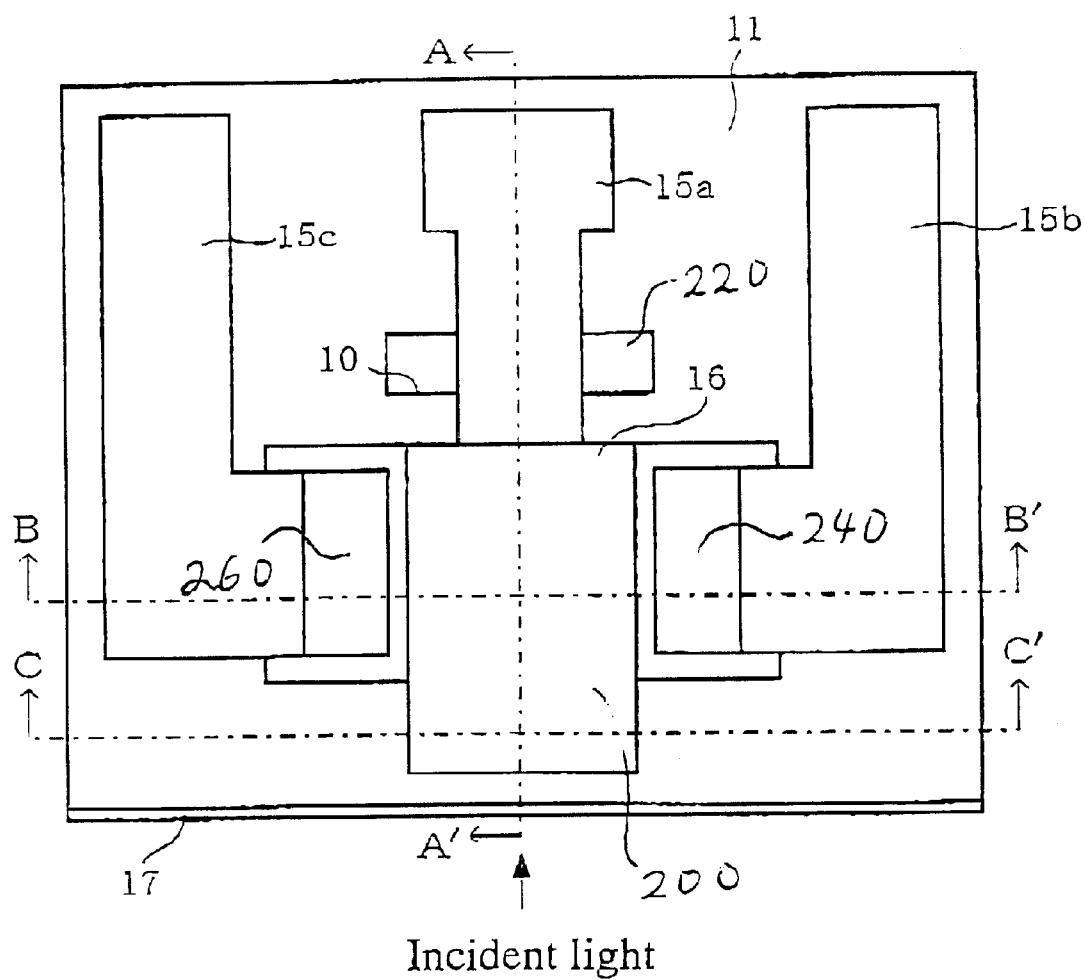
FIG. 5 is a plan view illustrative of a novel waveguide semiconductor photodetector in a second embodiment in accordance with the present invention.
Figure 6:
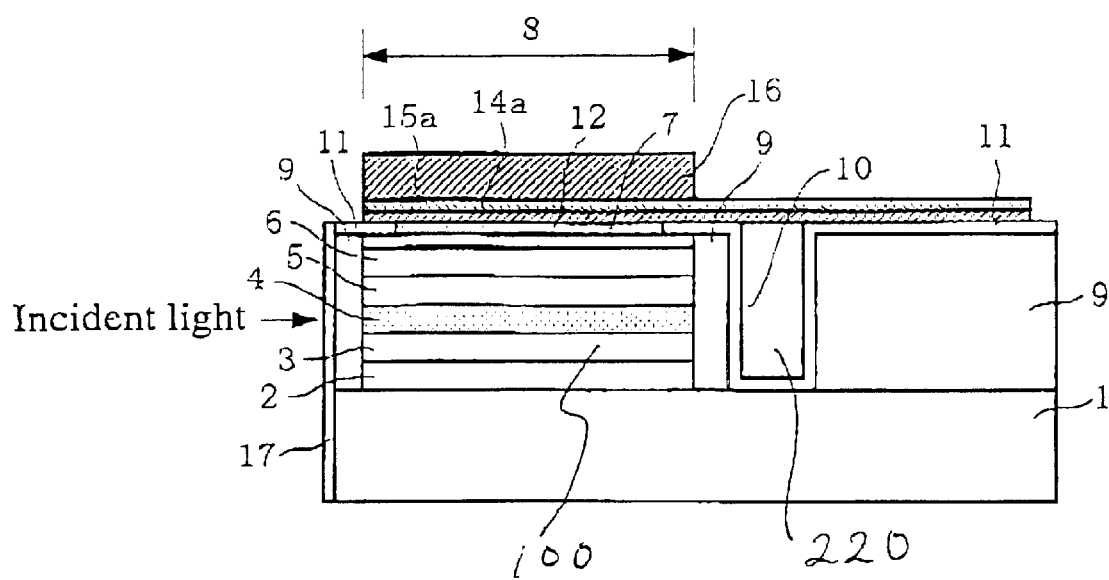
FIG. 6 is a cross sectional elevation view illustrative of a novel waveguide semiconductor photodetector, taken along an A–A' line of FIG. 5.
Figure 7:
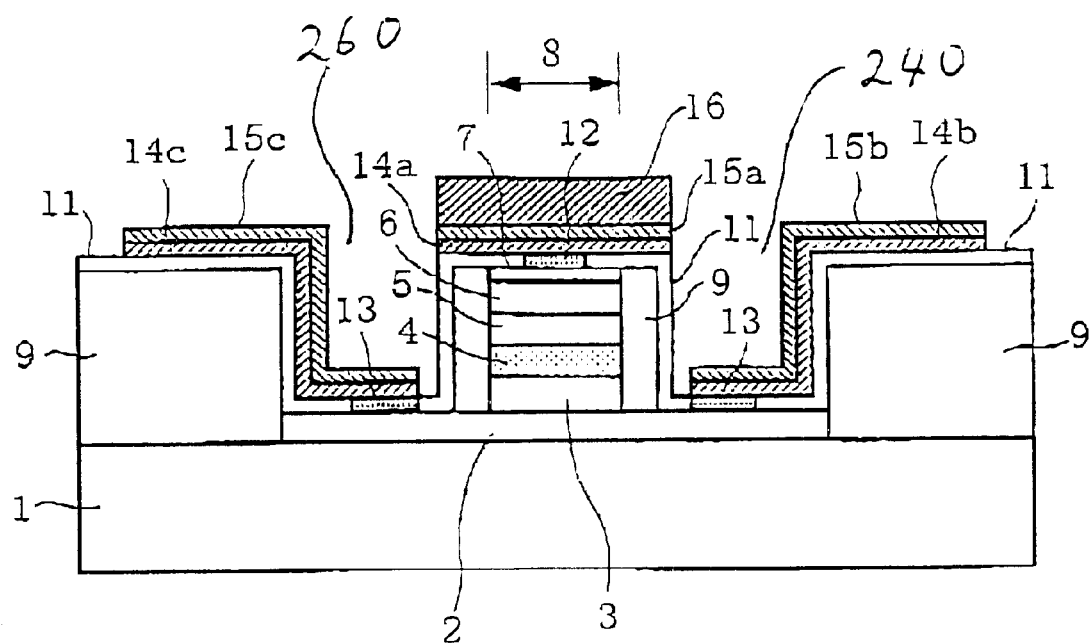
FIG. 7 is a cross sectional elevation view illustrative of a novel waveguide semiconductor photodetector, taken along a B–B' line of FIG. 5.
Figure 8:
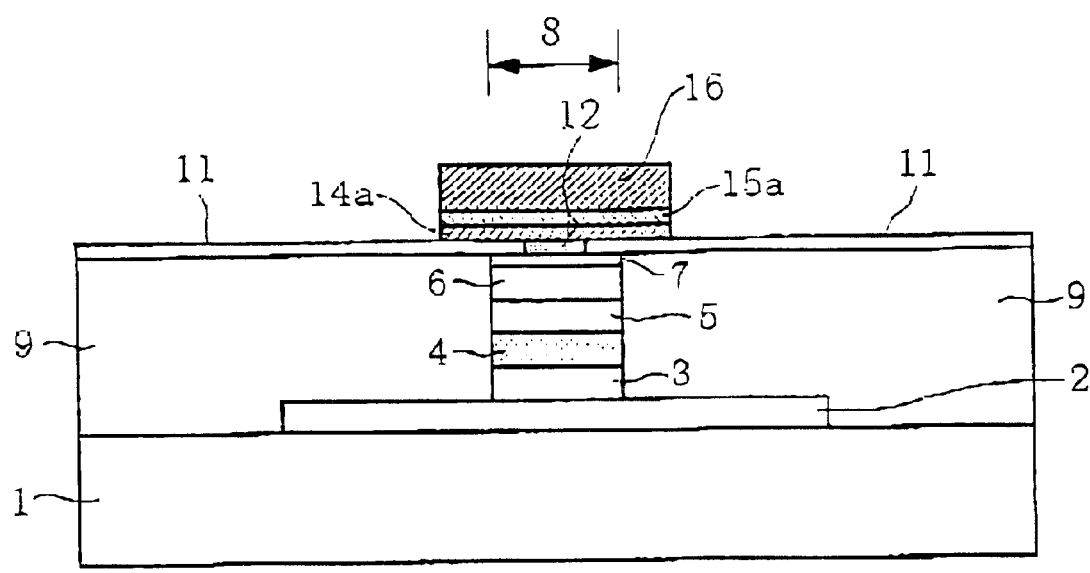
FIG. 8 is a cross sectional elevation view illustrative of a novel waveguide semiconductor photodetector, taken along a C–C' line of FIG. 5.

A second embodiment according to the present invention will be described in detail with reference to the drawings. FIG. 5 is a plan view illustrative of a novel waveguide semiconductor photodetector in a second embodiment in accordance with the present invention. FIG. 6 is a cross sectional elevation view illustrative of a novel waveguide semiconductor photodetector, taken along an A–A' line of FIG. 5. FIG. 7 is a cross sectional elevation view illustrative of a novel waveguide semiconductor photodetector, taken along a B–B' line of FIG. 5. FIG. 8 is a cross sectional elevation view illustrative of a novel waveguide semiconductor photodetector, taken along a C–C' line of FIG. 5.

A waveguide semiconductor photodetector includes a semi-insulating semiconductor substrate 1 and a heat radiation semiconductor layer 9 over the insulating substrate. A waveguide mesa structure 100 defines a photo-electric conversion region 8. The waveguide mesa structure 100 is buried in the heat radiation semiconductor layer 9, so that the waveguide mesa structure 100 is surrounded by and in contact with the heat radiation semiconductor layer 9. The waveguide mesa structure 100 extends on a waveguide mesa structure region 200. The waveguide mesa structure region 200 extends adjacent to a front side of the waveguide semiconductor photodetector, wherein a light is incident from the front side to the waveguide mesa structure 100. The direction of the incidence of the light is vertical to the front side face. An optical axis of the incident light is vertical to the front side face.

The heat radiation semiconductor layer 9 has a first groove 220, a second groove 240 and a third groove 260. The first groove 220 is positioned in back-side of the waveguide mesa structure 100. The first groove 220 is distanced from a back-side face of the waveguide mesa structure 100, so that the first groove 220 is isolated from the back-side face of the waveguide mesa structure 100 by a part of the heat radiation semiconductor layer 9.

The second groove 240 is positioned in the first-side of the waveguide mesa structure 100. The second groove 240 is distanced from a first-side face of the waveguide mesa structure 100, so that the second groove 240 is isolated from the first-side face of the waveguide mesa structure 100 by a part of the heat radiation semiconductor layer 9. Further, the second groove 240 is retreated from the front side, so that a front-side part of the waveguide mesa structure 100 is in contact with the thick part of the heat radiation semiconductor layer 9. Namely, the second groove 240 is positioned in the first-side of the waveguide mesa structure 100 except for the front-side part of the waveguide mesa structure 100. A heat generation upon the light incidence into the mesa structure is larger in the front-side part of the waveguide mesa structure 100 than the back-side part thereof. For this reason, the second groove 240 is retreated from the front side, so that a front-side part of the waveguide mesa structure 100 is in contact with the thick part of the heat radiation semiconductor layer 9.

The third groove 260 is positioned in the second-side of the waveguide mesa structure 100. The third groove 260 is distanced from a second-side face of the waveguide mesa structure 100, so that the third groove 260 is isolated from the second-side face of the waveguide mesa structure 100 by a part of the heat radiation semiconductor layer 9. Further, the third groove 260 is retreated from the front side, so that a front-side part of the waveguide mesa structure 100 is in contact with the thick part of the heat radiation semiconductor layer 9. Namely, the third groove 260 is positioned in the second-side of the waveguide mesa structure 100 except for the front-side part of the waveguide mesa structure 100. A heat generation upon the light incidence into the mesa structure is larger in the front-side part of the waveguide mesa structure 100 than the back-side part thereof. For this reason, the third groove 260 is retreated from the front side, so that a front-side part of the waveguide mesa structure 100 is in contact with the thick part of the heat radiation semiconductor layer 9.

The bottoms face of the waveguide mesa structure 100 is in contact with the semi-insulating semiconductor substrate 1. The front and back faces and first and second faces of the waveguide mesa structure 100 are in contact with or coated with the heat radiation semiconductor layer 9. The top surface of the waveguide mesa structure 100 is in contact with a multi-layer electrode structure which includes a heat radiative electrode 16.

The heat radiation semiconductor layer 9 has a high heat conductivity for acting as the heat radiator, wherein a heat generated in the waveguide mesa structure 100 is radiated to the heat radiation semiconductor layer 9. The heat radiative electrode 16 also has a high heat conductivity for acting as the heat radiator, wherein a heat generated in the waveguide mesa structure 100 is radiated to the heat radiative electrode 16.

Namely, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100.

The heat radiation semiconductor layer 9 may, for example, comprise an Fe-doped InP layer which is extremely higher in heat conductivity than silicon nitride and atmosphere. Needless to say, the heat radiation semiconductor layer 9 may be made of other materials which are much higher in heat conductivity than the silicon nitride and atmosphere.

The surface of the heat radiation semiconductor layer 9 is coated with a silicon nitride layer 11 except on the front face thereof, so that the side walls and a bottom of the first groove 220 and the side walls and a bottom of the second groove 240 as well as the side walls and a bottom of the third groove 260 are also coated with the silicon nitride layer 11.

The first groove 220 has a first depth which reaches the upper surface of the semi-insulating semiconductor substrate 1, so that the first groove 220 provides a back-side reflective mirror 10 to the waveguide mesa structure 100 for reflecting the light to the waveguide mesa structure 100. A closer side wall of the first groove 220 to the back-side face of the waveguide mesa structure 100 serves as a reflecting mirror. An anti-reflective film 17 is also provided on the front face of the waveguide semiconductor photodetector for allowing the incidence of the light into the waveguide mesa structure 100.

The second groove 240 has a second depth which reaches an upper surface of a bottom layer of the waveguide mesa structure 100. The silicon nitride layer 11 has a first opening on a part of the bottom of the second groove 240. A first polarity electrode structure comprises a pair of a first-side first polarity electrode structure and a second-side first polarity electrode structure. The first-side first polarity electrode structure is provided which extends from the bottom of the second groove 240 through the side wall of the second groove 240 over the top surface of the heat radiation semiconductor layer 9, so that the first-side first polarity electrode structure is electrically connected through the first opening to the bottom layer, for example, a first type conductivity cladding layer of the waveguide mesa structure 100.

The first-side first polarity electrode structure is thus electrically connected directly to the first type conductivity cladding layer of the waveguide mesa structure 100 at a closer position to the first side of the waveguide mesa structure 100, thereby obtaining an effective reduction to the parasitic resistance of the waveguide mesa structure 100. The first-side first polarity electrode structure extends in the first side region of the waveguide mesa structure 100.

The third groove 260 has the above second depth which reaches an upper surface of a bottom layer of the waveguide mesa structure 100. The silicon nitride layer 11 has a third opening on a part of the bottom of the third groove 260. The first-side second polarity electrode structure is provided which extends from the bottom of the third groove 260 through the side wall of the third groove 260 over the top surface of the heat radiation semiconductor layer 9, so that the first-side second polarity electrode structure is electrically connected through the third opening to the bottom layer, for example, the first type conductivity cladding layer of the waveguide mesa structure 100.

The first-side second polarity electrode structure is thus electrically connected directly to the first type conductivity cladding layer of the waveguide mesa structure 100 at a closer position to the first side of the waveguide mesa structure 100, thereby obtaining an effective reduction to the parasitic resistance of the waveguide mesa structure 100. The first-side second polarity electrode structure extends in the second side region of the waveguide mesa structure 100.

The second and third grooves 240 and 260 are retreated from the front side, so that a front-side part of the waveguide mesa structure 100 is in contact with the thick part of the heat radiation semiconductor layer 9. Namely, the second groove 240 is positioned in the first-side of the waveguide mesa structure 100 except for the front-side part of the waveguide mesa structure 100 as well as the third groove 260 is positioned in the second-side of the waveguide mesa structure 100 except for the front-side part of the waveguide mesa structure 100. A heat generation upon the light incidence into the mesa structure is larger in the front-side part of the waveguide mesa structure 100 than the back-side part thereof. For this reason, the second and third grooves 240 and 260 are retreated from the front side, so that a front-side part of the waveguide mesa structure 100 is in contact with the thick part of the heat radiation semiconductor layer 9.

The silicon nitride layer 11 also has a second opening which is positioned over the top surface of the waveguide mesa structure 100. A second polarity electrode structure is provided over the waveguide mesa structure 100. The second polarity electrode structure is electrically connected through the second opening to the top layer of second conductivity type of the waveguide mesa structure 100. The second polarity electrode structure extends from the top portion of the waveguide mesa structure 100 to the back-side of the waveguide mesa structure 100 over the heat radiative layer 9 beyond the first groove 220 with an air-bridge structure. The second polarity electrode structure is distanced from the back-side first polarity electrode structure.

The waveguide mesa structure 100 may be designed to adjust the waveguide length and the thickness of the optical absorption layer for obtaining both desirable high speed performances and high photoelectric conversion efficiency.

The first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

The second groove 240 is provided in the first side of the waveguide mesa structure 100 and is separated from but close to the first-side face of the waveguide mesa structure 100, so as to provide an electrical connection between the first-side first polarity electrode structure to the first conductivity type region of the waveguide mesa structure 100 for effective reduction to the waveguide semiconductor photodetector.

The third groove 260 is provided in the second side of the waveguide mesa structure 100 and is separated from but close to the second-side face of the waveguide mesa structure 100, so as to provide another electrical connection between the second-side first polarity electrode structure to the first conductivity type region of the waveguide mesa structure 100 for effective reduction to the waveguide semiconductor photodetector.

The waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and breakdown.

The above-described respective structural elements for the novel waveguide semiconductor photodetector may be realized as follows as one preferable examples.

The semi-insulating semiconductor substrate 1 may optically be made of InP. Various structures are available for the waveguide mesa structure 100. One preferable multi-layered waveguide mesa structures available would be as follows.

An n+–InP cladding layer 2 overlies a selected region of the semi-insulating InP substrate 1. An n+–InAlGaAs optical guide layer 3 overlies a selected region of the n+–InP cladding layer 2. The n+–InAlGaAs optical guide layer 3 has a wavelength composition of 1.3 micrometers. An i-InGaAs optical absorption layer 4 overlies the n+–InAlGaAs optical guide layer 3. The i-InGaAs optical absorption layer 4 has a thickness of 0.5 micrometers. A p+–InAlGaAs optical guide layer 5 overlies the i-InGaAs optical absorption layer 4. The p+–InAlGaAs optical guide layer 5 has a wavelength composition of 1.3 micrometers. A p+–InP cladding layer 6 overlies the p+–InAlGaAs optical guide layer 5. A p+–InGaAs contact layer 7 overlies the p+–InP cladding layer 6. The lamination of the n+–InAlGaAs optical guide layer 3, the i-InGaAs optical absorption layer 4, the p+–InAlGaAs optical guide layer 5, the p+–InP cladding layer 6 and the p+–InGaAs contact layer 7 forms the waveguide mesa structure 100.

The above-described first conductivity type bottom layer corresponds to the n+–InP cladding layer 2. The above-described photoelectric conversion region 8 may be, for example, 20 micrometers in size.

The above-described first-side first polarity electrode structure comprises an AuGeNi alloy electrode 13, a TiPtAu electrode 14b and an Au-plated electrode 15b. The AuGeNi alloy electrode 13 is provided in the first opening of the silicon nitride layer 11 so that the AuGeNi alloy electrode 13 is in contact with a part of the upper surface of the n+–InP cladding layer 2. The TiPtAu electrode 14b is in contact with the AuGeNi alloy electrode 13 and with the silicon nitride layer 11, so that the TiPtAu electrode 14b extends from the bottom of the second groove 240 along the side wall thereof and over the heat radiation semiconductor layer 9 on the first side region of the waveguide mesa structure 100. The Au-plated electrode 15b is laminated on the TiPtAu electrode 14b.

The above-described second-side first polarity electrode structure comprises an AuGeNi alloy electrode 13, a TiPtAu electrode 14c and an Au-plated electrode 15c. The AuGeNi alloy electrode 13 is provided in the third opening of the silicon nitride layer 11 so that the AuGeNi alloy electrode 13 is in contact with a part of the upper surface of the n+–InP cladding layer 2. The TiPtAu electrode 14c is in contact with the AuGeNi alloy electrode 13 and with the silicon nitride layer 11, so that the TiPtAu electrode 14c extends from the bottom of the third groove 260 along the side wall thereof and over the heat radiation semiconductor layer 9 on the first side region of the waveguide mesa structure 100. The Au-plated electrode 15c is laminated on the TiPtAu electrode 14c.

The above-described second polarity electrode structure comprises an AuZn alloy electrode 12, a TiPtAu electrode 14a and an Au-plated electrode 15a as well as a heat radiative electrode 16. The AuZn alloy electrode 12 is provided in the second opening of the silicon nitride layer 11 so that the AuZn alloy electrode 12 is in contact with the p+–InGaAs contact layer 7. The TiPtAu electrode 14a is in contact with the AuZn alloy electrode 12 and with the silicon nitride layer 11, so that the TiPtAu electrode 14b extends to the back-side of the waveguide mesa structure 100 and over the silicon nitride layer 11 on the heat radiative layer 9 beyond the first groove 220 with the air-bridge structure. The Au-plated electrode 15a is laminated on the TiPtAu electrode 14a. The heat radiative electrode 16 is selectively provided on the Au-plated electrode 15a. The heat radiative electrode 16 may comprise an Au-plated layer having a thickness of 5 micrometers. Au has a high heat conductivity. Other electrically conductive and highly heat conductive material such as Cu may also be available for the heat radiative electrode 16.

The above-described antireflective layer 17 may comprise a silicon nitride film 17.

As described above, the waveguide semiconductor photodetector of this embodiment may provide the following effects and advantages.

First, the waveguide mesa structure 100 may be designed to adjust the waveguide length and the thickness of the optical absorption layer for obtaining both desirable high speed performances and high photoelectric conversion efficiency.

Second, the first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

Third, the second groove 240 is provided in the first side of the waveguide mesa structure 100 and is separated from but close to the first-side face of the waveguide mesa structure 100, so as to provide an electrical connection between the first-side first polarity electrode structure to the first conductivity type region of the waveguide mesa structure 100 for effective reduction to the waveguide semiconductor photodetector.

Fourth, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and break-down.

Fifth, the second and third grooves 240 and 260 are retreated from the front side, so that a front-side part of the waveguide mesa structure 100 is in contact with the thick part of the heat radiation semiconductor layer 9. Namely, the second groove 240 is positioned in the first-side of the waveguide mesa structure 100 except for the front-side part of the waveguide mesa structure 100 as well as the third groove 260 is positioned in the second-side of the waveguide mesa structure 100 except for the front-side part of the waveguide mesa structure 100. A heat generation upon the light incidence into the mesa structure is larger in the front-side part of the waveguide mesa structure 100 than the back-side part thereof. For this reason, the second and third grooves 240 and 260 are retreated from the front side, so that a front-side part of the waveguide mesa structure 100 is in contact with the thick part of the heat radiation semiconductor layer 9.

Third Embodiment

Figure 9:
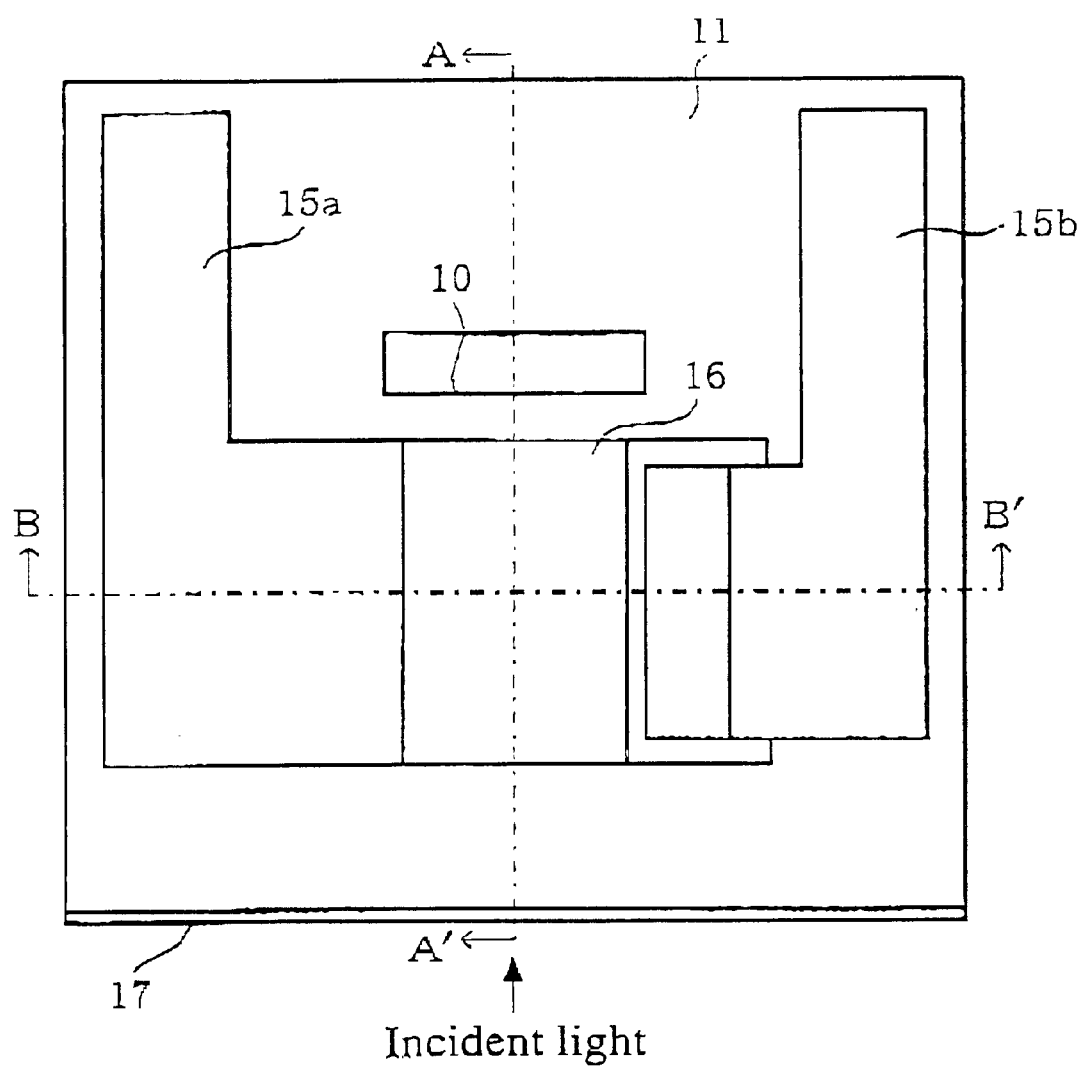
FIG. 9 is a plan view illustrative of a novel waveguide semiconductor photodetector in a third embodiment in accordance with the present invention.
Figure 10:
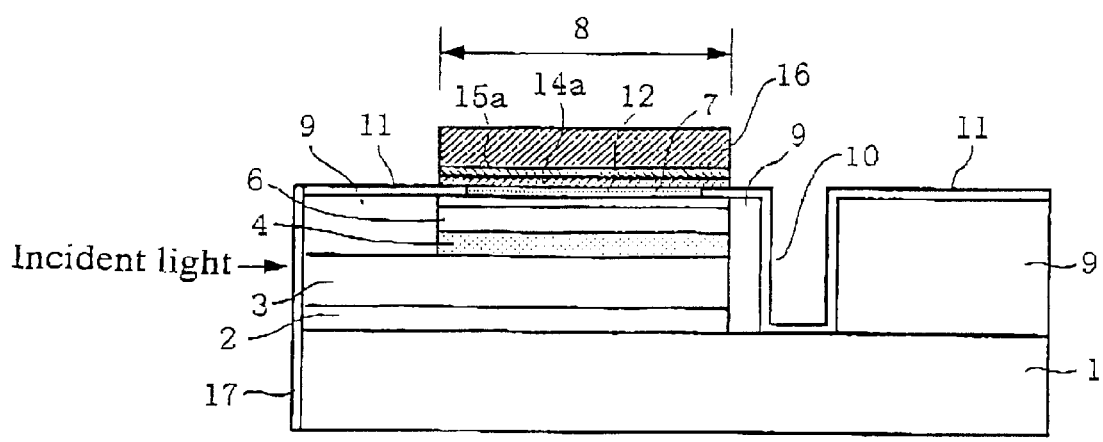
FIG. 10 is a cross sectional elevation view illustrative of a novel waveguide semiconductor photodetector, taken along an A–A' line of FIG. 9.
Figure 11:
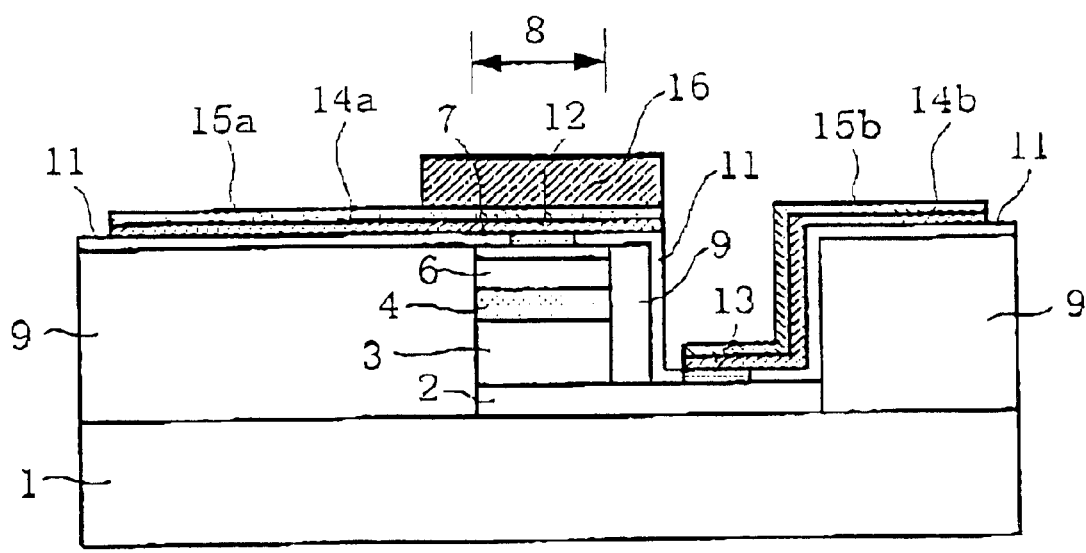
FIG. 11 is a cross sectional elevation view illustrative of a novel waveguide semiconductor photodetector, taken along a B–B' line of FIG. 9.

A third embodiment according to the present invention will be described in detail with reference to the drawings. FIG. 9 is a plan view illustrative of a novel waveguide semiconductor photodetector in a third embodiment in accordance with the present invention. FIG. 10 is a cross sectional elevation view illustrative of a novel waveguide semiconductor photodetector, taken along an A–A' line of FIG. 9. FIG. 11 is a cross sectional elevation view illustrative of a novel waveguide semiconductor photodetector, taken along a B–B' line of FIG. 9.

A waveguide semiconductor photodetector includes a semi-insulating semiconductor substrate 1 and a heat radiation semiconductor layer 9 over the insulating substrate. A waveguide mesa structure 100 defines a photo-electric conversion region 8. The waveguide mesa structure 100 is buried in the heat radiation semiconductor layer 9, so that the waveguide mesa structure 100 is surrounded by and in contact with the heat radiation semiconductor layer 9. The waveguide mesa structure 100 extends on a waveguide mesa structure region 200. The waveguide mesa structure region 200 extends adjacent to a front side of the waveguide semiconductor photodetector, wherein a light is incident from the front side to the waveguide mesa structure 100. The direction of the incidence of the light is vertical to the front side face. An optical axis of the incident light is vertical to the front side face.

The heat radiation semiconductor layer 9 has a first groove 220 and a second groove 240. The first groove 220 is positioned in back-side of the waveguide mesa structure 100. The first groove 220 is distanced from a back-side face of the waveguide mesa structure 100, so that the first groove 220 is isolated from the back-side face of the waveguide mesa structure 100 by a part of the heat radiation semiconductor layer 9.

The second groove 240 is positioned in the first-side of the waveguide mesa structure 100. The second groove 240 is distanced from a first-side face of the waveguide mesa structure 100, so that the second groove 240 is isolated from the first-side face of the waveguide mesa structure 100 by a part of the heat radiation semiconductor layer 9.

The bottoms face of the waveguide mesa structure 100 is in contact with the semi-insulating semiconductor substrate 1. The front and back faces and first and second faces of the waveguide mesa structure 100 are in contact with or coated with the heat radiation semiconductor layer 9. The top surface of the waveguide mesa structure 100 is in contact with a multi-layer electrode structure which includes a heat radiative electrode 16.

The heat radiation semiconductor layer 9 has a high heat conductivity for acting as the heat radiator, wherein a heat generated in the waveguide mesa structure 100 is radiated to the heat radiation semiconductor layer 9. The heat radiative electrode 16 also has a high heat conductivity for acting as the heat radiator, wherein a heat generated in the waveguide mesa structure 100 is radiated to the heat radiative electrode 16.

Namely, the upper part including the optical absorption layer of the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100.

The heat radiation semiconductor layer 9 may, for example, comprise an Fe-doped InP layer which is extremely higher in heat conductivity than silicon nitride and atmosphere. Needless to say, the heat radiation semiconductor layer 9 may be made of other materials which are much higher in heat conductivity than the silicon nitride and atmosphere.

The surface of the heat radiation semiconductor layer 9 is coated with a silicon nitride layer 11 except on the front face thereof, so that the side walls and a bottom of the first groove 220 as well as the side walls and a bottom of the second groove 240 are also coated with the silicon nitride layer 11.

The first groove 220 has a first depth which reaches the upper surface of the semi-insulating semiconductor substrate 1, so that the first groove 220 provides a back-side reflective mirror 10 to the waveguide mesa structure 100 for reflecting the light to the waveguide mesa structure 100. A closer side wall of the first groove 220 to the back-side face of the waveguide mesa structure 100 serves as a reflecting mirror. An anti-reflective film 17 is also provided on the front face of the waveguide semiconductor photodetector for allowing the incidence of the light into the waveguide mesa structure 100.

The second groove 240 has a second depth which reaches an upper surface of a bottom layer of the waveguide mesa structure 100. The silicon nitride layer 11 has a first opening on a part of the bottom of the second groove 240. A first polarity electrode structure is provided which extends from the bottom of the second groove 240 through the side wall of the second groove 240 over the top surface of the heat radiation semiconductor layer 9, so that the first polarity electrode structure is electrically connected through the first opening to the bottom layer, for example, a first type conductivity cladding layer of the waveguide mesa structure 100.

The first polarity electrode structure is thus electrically connected directly to the first type conductivity cladding layer of the waveguide mesa structure 100 at a closer position to the first side of the waveguide mesa structure 100, thereby obtaining an effective reduction to the parasitic resistance of the waveguide mesa structure 100. The first polarity electrode structure extends in the first side region of the waveguide mesa structure 100.

The silicon nitride layer 11 also has a second opening which is positioned over the top surface of the waveguide mesa structure 100. A second polarity electrode structure is provided over the waveguide mesa structure 100. The second polarity electrode structure is electrically connected through the second opening to the top layer of second conductivity type of the waveguide mesa structure 100. The second polarity electrode structure extends in the second side region of the waveguide mesa structure 100, so that the second polarity electrode structure is distanced from the first polarity electrode structure.

The waveguide mesa structure 100 may be designed to adjust the waveguide length and the thickness of the optical absorption layer for obtaining both desirable high speed performances and high photoelectric conversion efficiency.

The first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

The second groove 240 is provided in the first side of the waveguide mesa structure 100 and is separated from but close to the first-side face of the waveguide mesa structure 100, so as to provide an electrical connection between the first polarity electrode structure to the first conductivity type region of the waveguide mesa structure 100 for effective reduction to the waveguide semiconductor photodetector.

The upper part including the optical absorption layer of the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and break-down.

The above-described respective structural elements for the novel waveguide semiconductor photodetector may be realized as follows as one preferable examples.

The semi-insulating semiconductor substrate 1 may optically be made of InP. Various structures are available for the waveguide mesa structure 100. One preferable multi-layered waveguide mesa structures available would be as follows.

An n+−InP cladding layer 2 overlies a selected region of the semi-insulating InP substrate 1. An n+−InAlGaAs optical guide layer 3 overlies a selected region of the n+−InP cladding layer 2. The n+−InAlGaAs optical guide layer 3 has a wavelength composition of 1.3 micrometers. An i-InGaAs optical absorption layer 4 overlies a selected region of the n+−InAlGaAs optical guide layer 3. The i-InGaAs optical absorption layer 4 has a thickness of 0.5 micrometers. A p+−InP cladding layer 6 overlies the i-InGaAs optical absorption layer 4. A p+−InGaAs contact layer 7 overlies the p+−InP cladding layer 6. The lamination of the n+−InAlGaAs optical guide layer 3, the i-InGaAs optical absorption layer 4, the p+−InP cladding layer 6 and the p+−InGaAs contact layer 7 forms the waveguide mesa structure 100.

In this embodiment, the light is incident to the n+−InAlGaAs optical guide layer 3, but not to the i-InGaAs optical absorption layer 4. The light is incident to the n+−InAlGaAs optical guide layer 3 and then propagated to the photoelectric conversion region 8, where the light enters into the i-InGaAs optical absorption layer 4. Since the light is indirectly incident into the i-InGaAs optical absorption layer 4, a photoelectric current concentration is relaxed. This may contribute to prevent the waveguide semiconductor photodetector from deterioration and break-down.

Further, the n+−InP cladding layer 2 and the n+−InAlGaAs optical guide layer 3 extend adjacent to the front anti-reflective layer 17, whilst the i-InGaAs optical absorption layer 4, the p+−InP cladding layer 6 and the p+−InGaAs contact layer 7 are retreated from the front anti-reflective layer 17, and separated by a part of the heat radiation semiconductor layer 9 from the front anti-reflective layer 17. Namely, the lower part of the waveguide mesa structure 100 is surrounded by the heat radiation semiconductor layer 9 in the three directions, for example, the first and second sides and the back-side. The upper part of the waveguide mesa structure 100, for example, the lamination of the i-InGaAs optical absorption layer 4, the p+−InP cladding layer 6 and the p+−InGaAs contact layer 7 is omnidirectionally surrounded by the heat radiation semiconductor layer 9 in the four directions, for example, the first and second sides, and the front and back-sides.

The above-described first conductivity type bottom layer corresponds to the n+−InP cladding layer 2. The above-described photoelectric conversion region 8 may be, for example, 20 micrometers in size.

The above-described first polarity electrode structure comprises an AuGeNi alloy electrode 13, a TiPtAu electrode 14*b* and an Au-plated electrode 15*b*. The AuGeNi alloy electrode 13 is provided in the first opening of the silicon nitride layer 11 so that the AuGeNi alloy electrode 13 is in contact with a part of the upper surface of the n+–InP cladding layer 2. The TiPtAu electrode 14b is in contact with the AuGeNi alloy electrode 13 and with the silicon nitride layer 11, so that the TiPtAu electrode 14b extends from the bottom of the second groove 240 along the side wall thereof and over the heat radiation semiconductor layer 9 on the first side region of the waveguide mesa structure 100. The Au-plated electrode 15b is laminated on the TiPtAu electrode 14b.

The above-described second polarity electrode structure comprises an AuZn alloy electrode 12, a TiPtAu electrode 14a and an Au-plated electrode 15a as well as a heat radiative electrode 16. The AuZn alloy electrode 12 is provided in the second opening of the silicon nitride layer 11 so that the AuZn alloy electrode 12 is in contact with the p+–InGaAs contact layer 7. The TiPtAu electrode 14a is in contact with the AuZn alloy electrode 12 and with the silicon nitride layer 11, so that the TiPtAu electrode 14b extends over the heat radiation semiconductor layer 9 on the second side region of the waveguide mesa structure 100. The Au-plated electrode 15a is laminated on the TiPtAu electrode 14a. The heat radiative electrode 16 is selectively provided on the Au-plated electrode 15a. The heat radiative electrode 16 may comprise an Au-plated layer having a thickness of 5 micrometers. Au has a high heat conductivity. Other electrically conductive and highly heat conductive material such as Cu may also be available for the heat radiative electrode 16.

The above-described antireflective layer 17 may comprise a silicon nitride film 17.

As described above, the waveguide semiconductor photodetector of this embodiment may provide the following effects and advantages.

First, the waveguide mesa structure 100 may be designed to adjust the waveguide length and the thickness of the optical absorption layer for obtaining both desirable high speed performances and high photoelectric conversion efficiency.

Second, the first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

Third, the second groove 240 is provided in the first side of the waveguide mesa structure 100 and is separated from but close to the first-side face of the waveguide mesa structure 100, so as to provide an electrical connection between the first polarity electrode structure to the first conductivity type region of the waveguide mesa structure 100 for effective reduction to the waveguide semiconductor photodetector.

Fourth, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and break-down.

Fifth, the light is incident to the n+–InAlGaAs optical guide layer 3 and then propagated to the photoelectric conversion region 8, where the light enters into the i-InGaAs optical absorption layer 4. Since the light is indirectly incident into the i-InGaAs optical absorption layer 4, a photo-electric current concentration is relaxed. This may contribute to prevent the waveguide semiconductor photodetector from deterioration and break-down.

Fourth Embodiment

Figure 12:
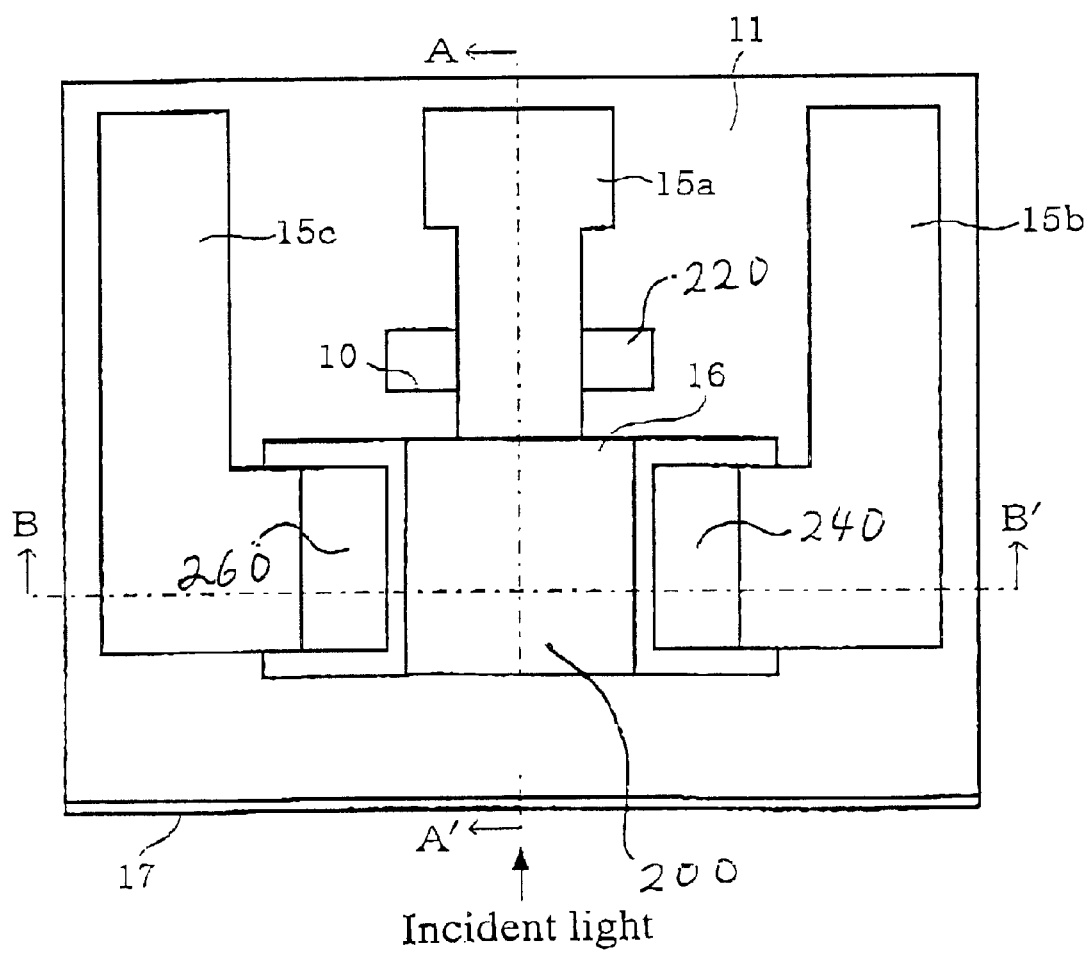
FIG. 12 is a plan view illustrative of a novel waveguide semiconductor photodetector in a fourth embodiment in accordance with the present invention.
Figure 13:
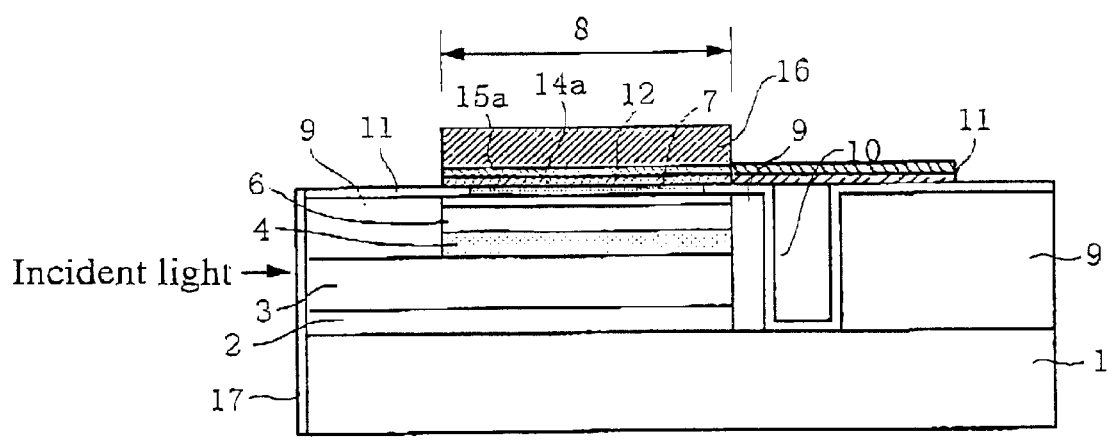
FIG. 13 is a cross sectional elevation view illustrative of a novel waveguide semiconductor photodetector, taken along an A–A' line of FIG. 12.

A fourth embodiment according to the present invention will be described in detail with reference to the drawings. The modified waveguide mesa structure of the third embodiment may be applicable to the second embodiment as illustrated in FIGS. 12 and 13. FIG. 12 is a plan view illustrative of a novel waveguide semiconductor photodetector in a fourth embodiment in accordance with the present invention. FIG. 13 is a cross sectional elevation view illustrative of a novel waveguide semiconductor photodetector, taken along an A–A' line of FIG. 12. This fourth embodiment may provides both the same effects as the second and third embodiments.

First, the waveguide mesa structure 100 may be designed to adjust the waveguide length and the thickness of the optical absorption layer for obtaining both desirable high speed performances and high photoelectric conversion efficiency.

Second, the first groove 220 providing the back-side reflective mirror 10 for reflecting the light to the waveguide mesa structure 100 for further increase in the photoelectric conversion efficiency. A majority of the incident power of light is absorbed into an optical absorption layer 4 included in the waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

Third, the second groove 240 is provided in the first side of the waveguide mesa structure 100 and is separated from but close to the first-side face of the waveguide mesa structure 100, so as to provide an electrical connection between the first-side first polarity electrode structure to the first conductivity type region of the waveguide mesa structure 100 for effective reduction to the waveguide semiconductor photodetector.

Fourth, the waveguide mesa structure 100 is omnidirectionally surrounded by the heat radiative structure which comprises the combination of the heat radiation semiconductor layer 9 with the heat radiative electrode 16, except the bottom face of the waveguide mesa structure 100 for obtaining highly effective heat radiation function from the waveguide mesa structure 100. This makes the waveguide semiconductor photodetector free from the above-described problem with the heat accumulation in the waveguide mesa structure 100 upon incidence of a relatively high power light, and the waveguide semiconductor photodetector shows stable operations without deterioration in performance and break-down.

Fifth, the second and third grooves 240 and 260 are retreated from the front side, so that a front-side part of the waveguide mesa structure 100 is in contact with the thick part of the heat radiation semiconductor layer 9. Namely, the second groove 240 is positioned in the first-side of the waveguide mesa structure 100 except for the front-side part of the waveguide mesa structure 100 as well as the third groove 260 is positioned in the second-side of the waveguide mesa structure 100 except for the front-side part of the waveguide mesa structure 100. A heat generation upon the light incidence into the mesa structure is larger in the front-side part of the waveguide mesa structure 100 than the back-side part thereof. For this reason, the second and third grooves 240 and 260 are retreated from the front side, so that a front-side part of the waveguide mesa structure 100 is in contact with the thick part of the heat radiation semiconductor layer 9.

Sixth, the light is incident to the n+–InAlGaAs optical guide layer 3 and then propagated to the photoelectric conversion region 8, where the light enters into the i-InGaAs optical absorption layer 4. Since the light is indirectly incident into the i-InGaAs optical absorption layer 4, a photoelectric current concentration is relaxed. This may contribute to prevent the waveguide semiconductor photodetector from deterioration and break-down.

Fifth Embodiment

Figure 14:
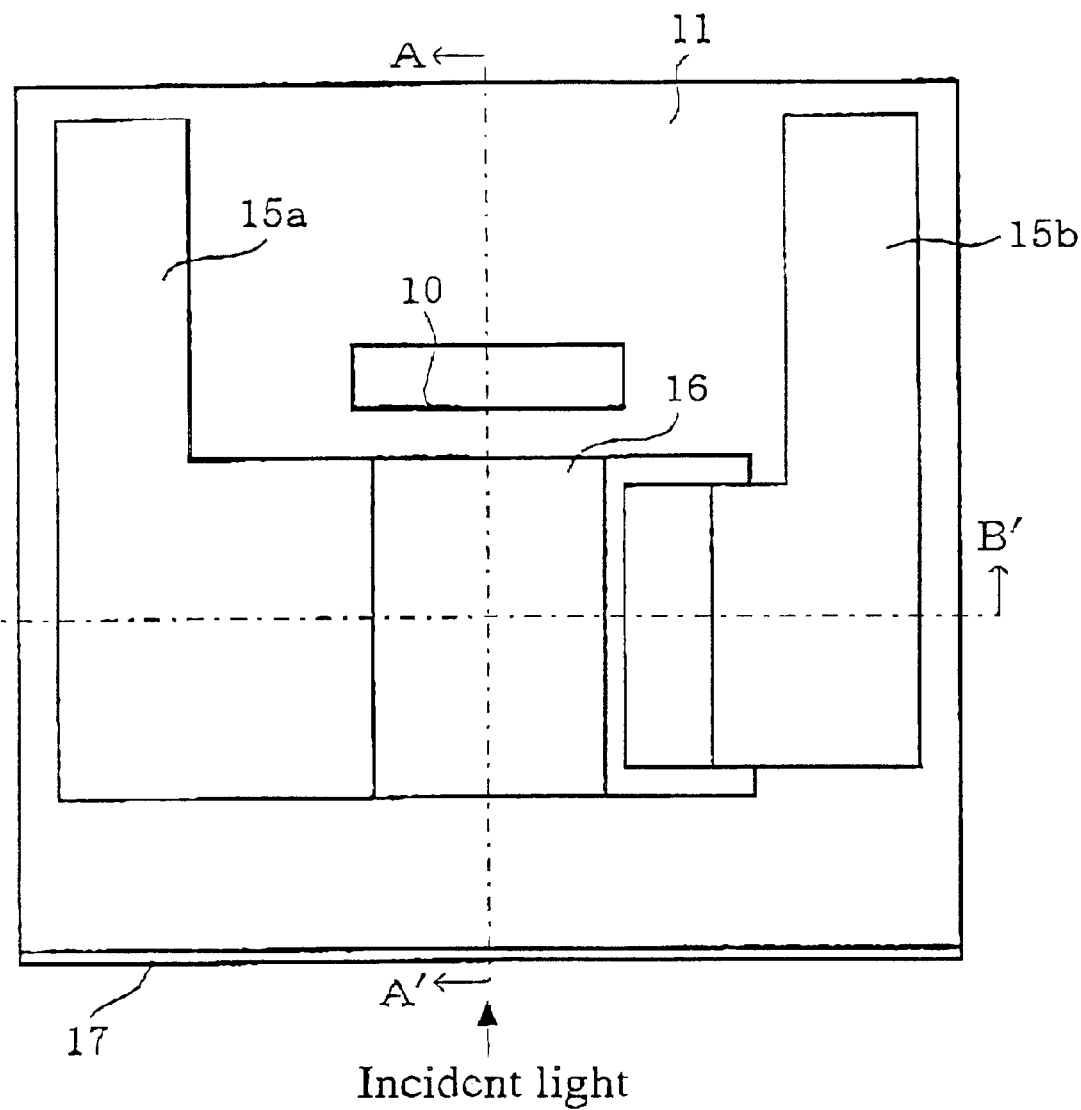
FIG. 14 is a plan view illustrative of a novel waveguide semiconductor photodetector in a fifth embodiment in accordance with the present invention.
Figure 15:
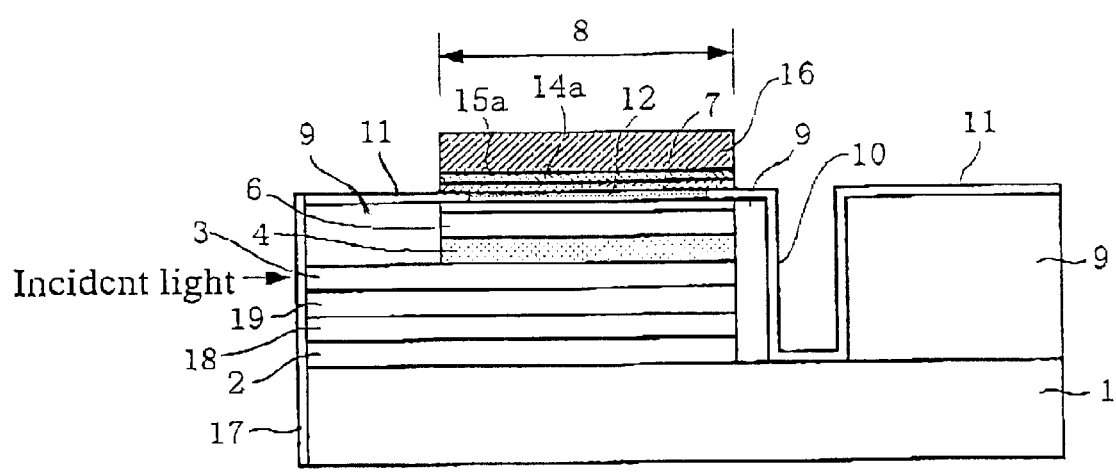
FIG. 15 is a cross sectional elevation view illustrative of a novel waveguide semiconductor photodetector, taken along an A–A' line of FIG. 14.

A fifth embodiment according to the present invention will be described in detail with reference to the drawings. FIG. 14 is a plan view illustrative of a novel waveguide semiconductor photodetector in a fifth embodiment in accordance with the present invention. FIG. 15 is a cross sectional elevation view illustrative of a novel waveguide semiconductor photodetector, taken along an A–A' line of FIG. 14.

A waveguide semiconductor photodetector includes a semi-insulating semiconductor substrate 1 and a heat radiation semiconductor layer 9 over the insulating substrate. A modified waveguide mesa structure 100 defines a photoelectric conversion region 8. The modified waveguide mesa structure 100 is buried in the heat radiation semiconductor layer 9, so that the modified waveguide mesa structure 100 is surrounded by and in contact with the heat radiation semiconductor layer 9. The modified waveguide mesa structure 100 extends on a modified waveguide mesa structure region 200. The modified waveguide mesa structure region 200 extends adjacent to a front side of the waveguide semiconductor photodetector, wherein a light is incident from the front side to the modified waveguide mesa structure 100. The direction of the incidence of the light is vertical to the front side face. An optical axis of the incident light is vertical to the front side face.

The heat radiation semiconductor layer 9 has a first groove 220 and a second groove 240. The first groove 220 is positioned in back-side of the modified waveguide mesa structure 100. The first groove 220 is distanced from a back-side face of the modified waveguide mesa structure 100, so that the first groove 220 is isolated from the back-side face of the modified waveguide mesa structure 100 by a part of the heat radiation semiconductor layer 9.

The second groove 240 is positioned in the first-side of the modified waveguide mesa structure 100. The second groove 240 is distanced from a first-side face of the modified waveguide mesa structure 100, so that the second groove 240 is isolated from the first-side face of the modified waveguide mesa structure 100 by a part of the heat radiation semiconductor layer 9.

The bottoms face of the modified waveguide mesa structure 100 is in contact with the semi-insulating semiconductor substrate 1. The front and back faces and first and second faces of the modified waveguide mesa structure 100 are in contact with or coated with the heat radiation semiconductor layer 9. The top surface of the modified waveguide mesa structure 100 is in contact with a multi-layer electrode structure which includes a heat radiative electrode 16.

The heat radiation semiconductor layer 9 has a high heat conductivity for acting as the heat radiator, wherein a heat generated in the modified waveguide mesa structure 100 is radiated to the heat radiation semiconductor layer 9. The heat radiative electrode 16 also has a high heat conductivity for acting as the heat radiator, wherein a heat generated in the modified waveguide mesa structure 100 is radiated to the heat radiative electrode 16.

Namely, the upper part including the optical absorption layer of the modified waveguide mesa structure 100 is omnidirectionally surrounded by the heat radiative structure which comprises the combination of the heat radiation semiconductor layer 9 with the heat radiative electrode 16, except the bottom face of the modified waveguide mesa structure 100.

The heat radiation semiconductor layer 9 may, for example, comprise an Fc-doped InP layer which is extremely higher in heat conductivity than silicon nitride and atmosphere. Needless to say, the heat radiation semiconductor layer 9 may be made of other materials which are much higher in heat conductivity than the silicon nitride and atmosphere.

The surface of the heat radiation semiconductor layer 9 is coated with a silicon nitride layer 11 except on the front face thereof, so that the side walls and a bottom of the first groove 220 as well as the side walls and a bottom of the second groove 240 are also coated with the silicon nitride layer 11.

The first groove 220 has a first depth which reaches the upper surface of the semi-insulating semiconductor substrate 1, so that the first groove 220 provides a back-side reflective mirror 10 to the modified waveguide mesa structure 100 for reflecting the light to the modified waveguide mesa structure 100. A closer side wall of the first groove 220 to the back-side face of the modified waveguide mesa structure 100 serves as a reflecting mirror. An anti-reflective film 17 is also provided on the front face of the waveguide semiconductor photodetector for allowing the incidence of the light into the modified waveguide mesa structure 100.

The second groove 240 has a second depth which reaches an upper surface of a bottom layer of the modified waveguide mesa structure 100. The silicon nitride layer 11 has a first opening on a part of the bottom of the second groove 240. A first polarity electrode structure is provided which extends from the bottom of the second groove 240 through the side wall of the second groove 240 over the top surface of the heat radiation semiconductor layer 9, so that the first polarity electrode structure is electrically connected through the first opening to the bottom layer, for example, a first type conductivity cladding layer of the modified waveguide mesa structure 100.

The first polarity electrode structure is thus electrically connected directly to the first type conductivity cladding layer of the modified waveguide mesa structure 100 at a closer position to the first side of the modified waveguide mesa structure 100, thereby obtaining an effective reduction to the parasitic resistance of the modified waveguide mesa structure 100. The first polarity electrode structure extends in the first side region of the modified waveguide mesa structure 100.

The silicon nitride layer 11 also has a second opening which is positioned over the top surface of the modified waveguide mesa structure 100. A second polarity electrode structure is provided over the modified waveguide mesa structure 100. The second polarity electrode structure is electrically connected through the second opening to the top layer of second conductivity type of the modified waveguide mesa structure 100. The second polarity electrode structure extends in the second side region of the modified waveguide mesa structure 100, so that the second polarity electrode structure is distanced from the first polarity electrode structure.

The modified waveguide mesa structure 100 may be designed to adjust the waveguide length and the thickness of the optical absorption layer for obtaining both desirable high speed performances and high photoelectric conversion efficiency.

The first groove 220 providing the back-side reflective mirror 10 for reflecting the light to the modified waveguide mesa structure 100 for further increase in the photoelectric conversion efficiency. A majority of the incident power of light is absorbed into an optical absorption layer 4 included in the modified waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

The second groove 240 is provided in the first side of the modified waveguide mesa structure 100 and is separated from but close to the first-side face of the modified waveguide mesa structure 100, so as to provide an electrical connection between the first polarity electrode structure to the first conductivity type region of the modified waveguide mesa structure 100 for effective reduction to the waveguide semiconductor photodetector.

The upper part including the optical absorption layer of the modified waveguide mesa structure 100 is omnidirectionally surrounded by the heat radiative structure which comprises the combination of the heat radiation semiconductor layer 9 with the heat radiative electrode 16, except the bottom face of the modified waveguide mesa structure 100 for obtaining highly effective heat radiation function from the modified waveguide mesa structure 100. This makes the waveguide semiconductor photodetector free from the above-described problem with the heat accumulation in the modified waveguide mesa structure 100 upon incidence of a relatively high power light, and the waveguide semiconductor photodetector shows stable operations without deterioration in performance and break-down.

The above-described respective structural elements for the novel waveguide semiconductor photodetector may be realized as follows as one preferable examples.

The semi-insulating semiconductor substrate 1 may optically be made of InP. Various structures are available for the modified waveguide mesa structure 100. One preferable multi-layered modified waveguide mesa structures available would be as follows.

An n+–InP cladding layer 2 overlies a selected region of the semi-insulating InP substrate 1. An n+–InAlGaAs optical guide layer 18 overlies the n+–InP cladding layer 2. An n+–InAlGaAs optical guide layer 19 overlies the n+–InAlGaAs optical guide layer 18. An n+–InGaAsP optical guide layer 3 overlies the n+–InAlGaAs optical guide layer 19.

The n+–InGaAsP optical guide layer 3 has a wavelength composition of 1.3 micrometers. An i-InGaAs optical absorption layer 4 overlies a selected region of the n+–InGaAsP optical guide layer 3. The i-InGaAs optical absorption layer 4 has a thickness of 0.5 micrometers. A p+–InP cladding layer 6 overlies the i-InGaAs optical absorption layer 4. A p+–InGaAs contact layer 7 overlies the p+–InP cladding layer 6. The lamination of the n+–InGaAsP optical guide layer 3, the i-InGaAs optical absorption layer 4, the p+–InP cladding layer 6 and the p+–InGaAs contact layer 7 forms the modified waveguide mesa structure 100.

Namely, the n-side optical guide region comprises a multi-layered structure of laminations of the optical guide layers 18, 19 and 3. The top n+–InGaAsP optical guide layer 3 has a wavelength composition of 1.3 micrometers. The intermediate n+–InAlGaAs optical guide layer 19 has a wavelength composition of 1.2 micrometers. The bottom n+–InAlGaAs optical guide layer 18 has a wavelength composition of 1.1 micrometers. Namely, the top n+–InGaAsP optical guide layer 3 adjacent to the optical absorption layer 4 is largest in wavelength composition, whilst the bottom n+–InAlGaAs optical guide layer 18 is smallest in wavelength composition.

The n-side optical guide region of the multi-layered structure becomes larger in wavelength composition toward the optical absorption layer 4. Namely, the n-side optical guide region of the multi-layered structure becomes larger in refractive index toward the optical absorption layer 4. The light is likely to enter into the larger wavelength composition layer or the larger refractive index layer, so that the incident light is effectively and efficiently guided to the optical absorption layer 4. This structure further improves the photoelectric conversion efficiency and the sensitivity.

Further, the top optical guide layer 3 adjacent to the optical absorption layer 4 is made of n+–InGaAsP, whilst the intermediate and bottom optical guide layers 19 and 18 separated from the optical absorption layer 4 are made of n+–InAlGaAs, for which reason a dark current is well suppressed.

InAlGaAs includes aluminum which has a high chemical-reactivity. If the Fe-doped InP layer 9 is directly formed on the InAlGaAs layer, oxide is likely to remain on an interface between Fe-doped InP and InAlGaAs. The residual oxide deteriorates crystal quality of the Fe-doped InP region adjacent to the interface, to cause a dark current. The top optical guide layer 3 adjacent to the optical absorption layer 4 is made of n+–InGaAsP, which is free of aluminum for preventing the dark current.

InGaAsP includes two Group-V elements, for example, As and P, for which reason it is not easy to control the composition. If plural different composition InGaAsP layers are grown, then a difference in lattice constant or a lattice mismatch between the plural different composition InGaAsP layers could result in deterioration in crystal quality. This deterioration in crystal quality may cause a dark current.

The above described multi-layer structure of the n-side optical guide layers 18, 19 and 3 are free from the above problems with the dark currents. The above described multi-layer structure of the n-side optical guide layers 18, 19 and 3 may also he applicable to the foregoing embodiments.

In this embodiment, the light is incident to the n+–InGaAsP optical guide layer 3, but not to the i-InGaAs optical absorption layer 4. The light is incident to the n+–InGaAsP optical guide layer 3 and then propagated to the photoelectric conversion region 8, where the light enters into the i-InGaAs optical absorption layer 4. Since the light is indirectly incident into the i-InGaAs optical absorption layer 4, a photo-electric current concentration is relaxed.

This may contribute to prevent the waveguide semiconductor photodetector from deterioration and break-down.

Further, the n+–InP cladding layer 2, the n+–InAlGaAs optical guide layers 18 and 19 and the n+–InGaAsP optical guide layer 3 extend adjacent to the front anti-reflective layer 17, whilst the i-InGaAs optical absorption layer 4, the p+–InP cladding layer 6 and the p+–InGaAs contact layer 7 are retreated from the front anti-reflective layer 17, and separated by a part of the heat radiation semiconductor layer 9 from the front anti-reflective layer 17. Namely, the lower part of the modified waveguide mesa structure 100 is surrounded by the heat radiation semiconductor layer 9 in the three directions, for example, the first and second sides and the back-side. The upper part of the modified waveguide mesa structure 100, for example, the lamination of the i-InGaAs optical absorption layer 4, the p+–InP cladding layer 6 and the p+–InGaAs contact layer 7 is onnidirectionally surrounded by the heat radiation semiconductor layer 9 in the four directions, for example, the first and second sides and the front and back-sides.

The above-described first conductivity type bottom layer corresponds to the n+–InP cladding layer 2. The above-described photoelectric conversion region 8 may be, for example, 20 micrometers in size.

The above-described first polarity electrode structure comprises an AuGeNi alloy electrode 13, a TiPtAu electrode 14b and an Au-plated electrode 15b. The AuGeNi alloy electrode 13 is provided in the first opening of the silicon nitride layer 11 so that the AuGeNi alloy electrode 13 is in contact with a part of the upper surface of the n+–InP cladding layer 2. The TiPtAu electrode 14b is in contact with the AuGeNi alloy electrode 13 and with the silicon nitride layer 15 so that the TiPtAu electrode 14b extends from the bottom of the second groove 240 along the side wall thereof and over the heat radiation semiconductor layer 9 on the first side region of the modified waveguide mesa structure 100. The Au-plated electrode 15b is laminated on the TiPtAu electrode 14b.

The above-described second polarity electrode structure comprises an AuZn alloy electrode 12, a TiPtAu electrode 14a and an Au-plated electrode 15a as well as a heat radiative electrode 16. The AuZn alloy electrode 12 is provided in the second opening of the silicon nitride layer 11 so that the AuZn alloy electrode 12 is in contact with the p+–InGaAs contact layer 7. The TiPtAu electrode 14a is in contact with the AuZn alloy electrode 12 and with the silicon nitride layer 11, so that the TiPtAu electrode 14b extends over the heat radiation semiconductor layer 9 on the second side region of the modified waveguide mesa structure 100. The Au-plated electrode 15a is laminated on the TiPtAu electrode 14a. The heat radiative electrode 16 is selectively provided on the Au-plated electrode 15a. The heat radiative electrode 16 may comprise an Au-plated layer having a thickness of 5 micrometers. Au has a high heat conductivity. Other electrically conductive and highly heat conductive material such as Cu may also be available for the heat radiative electrode 16.

The above-described antireflective layer 17 may comprise a silicon nitride film 17.

As described above, the waveguide semiconductor photodetector of this embodiment may provide the following effects and advantages.

First, the modified waveguide mesa structure 100 may be designed to adjust the waveguide length and the thickness of the optical absorption layer for obtaining both desirable high speed performances and high photoelectric conversion efficiency.

Second, the first groove 220 providing the back-side reflective mirror 10 for reflecting the light to the modified waveguide mesa structure 100 for further increase in the photoelectric conversion efficiency. A majority of the incident power of light is absorbed into an optical absorption layer 4 included in the modified waveguide mesa structure 100. A minority of the incident power of light may pass through the optical absorption layer 4, but reflected by the back-side reflective mirror 10 to the optical absorption layer 4, wherein the reflected light may be absorbed into the optical absorption layer 4. As a result, the photoelectric conversion efficiency is increased.

Third, the second groove 240 is provided in the first side of the modified waveguide mesa structure 100 and is separated from but close to the first-side face of the modified waveguide mesa structure 100, so as to provide an electrical connection between the first polarity electrode structure to the first conductivity type region of the modified waveguide mesa structure 100 for effective reduction to the waveguide semiconductor photodetector.

Fourth, the modified waveguide mesa structure 100 is omnidirectionally surrounded by the heat radiative structure which comprises the combination of the heat radiation semiconductor layer 9 with the heat radiative electrode 16, except the bottom face of the modified waveguide mesa structure 100 for obtaining highly effective heat radiation function from the modified waveguide mesa structure 100. This makes the waveguide semiconductor photodetector free form the above-described problem with the heat accumulation in the modified waveguide mesa structure 100 upon incidence of a relatively high power light, and the waveguide semiconductor photodetector shows stable operations without deterioration in performance and break-down.

Fifth, the light is incident to the n+–InGaAsP optical guide layer 3 and then propagated to the photoelectric conversion region 8, where the light enters into the i-InGaAs optical absorption layer 4. Since the light is indirectly incident into the i-InGaAs optical absorption layer 4, a photo-electric current concentration is relaxed. This may contribute to prevent the waveguide semiconductor photodetector from deterioration and break-down.

Sixth, the n-side optical guide region of the multi-layered structure becomes larger in wavelength composition toward the optical absorption layer 4. Namely, the n-side optical guide region of the multi-layered structure becomes larger in refractive index toward the optical absorption layer 4. The light is likely to enter into the larger wavelength composition layer or the larger refractive index layer, so that the incident light is effectively and efficiently guided to the optical absorption layer 4. This structure further improves the photoelectric conversion efficiency and the sensitivity. Further, the top optical guide layer 3 adjacent to the optical absorption layer 4 is made of n+–InGaAsP, whilst the intermediate and bottom optical guide layers 19 and 18 separated from the optical absorption layer 4 are made of n+–InAlGaAs, for which reason a dark current is well suppressed.

Sixth Embodiment

Figure 16:
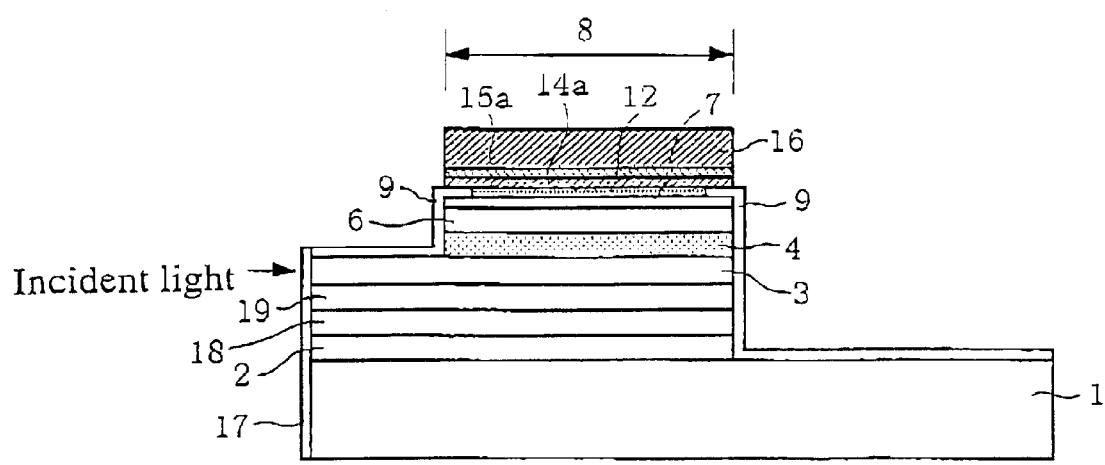
FIG. 16 is a cross sectional elevation view illustrative of a novel waveguide semiconductor photodetector in a sixth embodiment in accordance with the present invention.

A sixth embodiment according to the present invention will be described in detail with reference to the drawings. FIG. 16 is a cross sectional elevation view illustrative of a novel waveguide semiconductor photodetector in a sixth embodiment in accordance with the present invention. The sixth embodiment modifies the above-described fifth embodiment but only in that the heat radiation semiconductor layer 9 is uniformly thin, and has no groove as well as no nitride layer is formed as illustrated in FIG. 16. This structure is so called as epi-passivation structure.

Since the heat radiation semiconductor layer 9 is uniformly thin, then the heat radiation effect is not so high as compared to the foregoing embodiments. The heat radiation semiconductor layer 9 thus serve as a passivation layer in place of the silicon nitride layer 11 in the foregoing embodiments. The Fe-doped InP heat radiation semiconductor layer 9 serving as the passivation layer is more stable for a long time as compared to the silicon nitride layer 11. The Fc-doped InP heat radiation semiconductor layer 9 serving as the passivation layer provides a long time high reliability to the waveguide semiconductor photodetector.

In the first through sixth embodiments, the photoelectric conversion region has the pin-photodiode structure. Notwithstanding, it is also possible that the photoelectric converter has other photodiode structures, for example, an avalanche photodiode structure, and a Schottky photodiode structure.

In the first through sixth embodiments, the heat radiation semiconductor layer 9 exists between the photoelectric conversion region and the back-side reflective mirror. Notwithstanding, it is also possible that the back-side reflective mirror is formed adjacent to the back-side face of the waveguide mesa structure.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device including:
   a waveguide mesa structure including at least an optical absorption layer for photoelectric conversion; and
   a heat radiation semiconductor layer in contact directly with at least a part of said optical absorption layer for heat radiation from said optical absorption layer, and said heat radiation semiconductor layer being lower in refractive index and larger in energy band gap than said optical absorption layer, wherein,
   said optical absorption layer and said waveguide mesa structure are at least partially surrounded by and in contact directly with said heat radiation semiconductor layer,
   said optical absorption layer is omnidirectionally surrounded by said heat radiation semiconductor layer
   said wave guide mesa structure is at least partially surrounded by and in contact directly with said heat radiation semiconductor layer
   said heat radiation semiconductor layer is so thick that said waveguide mesa structure is buried in said heat radiation semiconductor layer, and
   said heat radiation semiconductor layer has a first groove which is positioned in a back-side of said waveguide mesa structure, and said back-side is opposite to a front side, from which a light is incident into said waveguide mesa structure, and said first groove acting as a back-side reflective mirror for reflecting a light to said waveguide mesa structure.

2. The semiconductor device as claimed in claim 1, wherein said waveguide mesa structure is omnidirectionally surrounded by said heat radiation semiconductor layer.

3. The semiconductor device as claimed in claim 1, wherein said heat radiation semiconductor layer has a top surface which is almost the same level as a top of said waveguide mesa structure.

4. The semiconductor device as claimed in claim 1, wherein said first groove is separated from a back-side face of said waveguide mesa structure by a part of said heat radiation semiconductor layer.

5. The semiconductor device as claimed in claim 1, wherein said first groove is adjacent to a back-side face of said waveguide mesa structure.

6. A semiconductor device including:
   a waveguide mesa structure including at least an optical absorption layer for photoelectric conversion; and
   a heat radiation semiconductor layer in contact directly with at least a part of said optical absorption layer for heat radiation from said optical absorption layer, and said heat radiation semiconductor layer being lower in refractive index and larger in energy band gap than said optical absorption layer, wherein,
   said optical absorption layer and said waveguide mesa structure are at least partially surrounded by and in contact directly with said heat radiation semiconductor layer,
   said optical absorption layer is omnidirectionally surrounded by said heat radiation semiconductor layer
   said waveguide mesa structure is at least partially surrounded by and in contact directly with said heat radiation semiconductor layer,
   said heat radiation semiconductor layer is so thick that said waveguide mesa structure is buried in said heat radiation semiconductor layer, and
   at least a first-polarity electrode structure which is electrically connected to a lower region than said optical absorption layer of said waveguide mesa structure from a first side of said waveguide mesa structure, and said first side being opposite to a second side, and said first and second sides being distanced in a direction perpendicular to an incident direction of an incident light.

7. The semiconductor device as claimed in claim 6, wherein said heat radiation semiconductor layer has a second groove which is positioned in said first side of said waveguide mesa structure, and said second groove reaches a first contact part of a bottom cladding layer extending from said lower region of said waveguide mesa structure, and said first contact part of said bottom cladding layer is positioned close to said waveguide mesa structure.

8. The semiconductor device as claimed in claim 7, wherein said second groove is separated from said waveguide mesa structure by a part of said heat radiation semiconductor layer.

9. The semiconductor device as claimed in claim 7, wherein in said incident direction of said incident light, said second groove is retreated from said front side and extends in a smaller extent than an entirety of said waveguide mesa structure.

10. The semiconductor device as claimed in claim 1, further comprising:
    a first-side first-polarity electrode structure which is electrically connected to a lower region than said optical absorption layer of said waveguide mesa structure from a first side of said waveguide mesa structure, and said first side being opposite to a second side, and said first and second sides being distanced in a direction perpendicular to an incident direction of an incident light; and a second-side first-polarity electrode structure which is electrically connected to said lower region than said optical absorption layer of said waveguide mesa structure from a second side of said waveguide mesa structure.

11. The semiconductor device as claimed in claim 10, wherein said heat radiation semiconductor layer has second and third grooves, and said second groove is positioned in said first side of said waveguide mesa structure, and said third groove is positioned in said second side of said waveguide mesa structure, and said second groove reaches a first contact part of a bottom cladding layer extending from said lower region of said waveguide mesa structure, and said third groove reaches a second contact part of said bottom cladding layer extending from said lower region of said waveguide mesa structure, and said first and second contact parts of said bottom cladding layer are positioned close to said waveguide mesa structure.

12. The semiconductor device as claimed in claim 11, wherein said second and third grooves are separated from said waveguide mesa structure by parts of said heat radiation semiconductor layer.

13. The semiconductor device as claimed in claim 11, wherein in said incident direction of said incident light, said second and third grooves extend in almost the same extent as an entirety of said waveguide mesa structure.

14. The semiconductor device as claimed in claim 11, wherein in said incident direction of said incident light, said second and third grooves are retreated from said front side and extend in a smaller extent than an entirety of said waveguide mesa structure.

15. The semiconductor device as claimed in claim 1, wherein said heat radiation semiconductor layer is so thin that said waveguide mesa structure is coated with said heat radiation semiconductor layer.

16. The semiconductor device as claimed in claim 15, further comprising:

at least a first-polarity electrode structure which is electrically connected to a lower region than said optical absorption layer of said waveguide mesa structure from a first side of said waveguide mesa structure, and said first side being opposite to a second side, and said first and second sides being distanced in a direction perpendicular to an incident direction of an incident light.

17. The semiconductor device as claimed in claim 15, further comprising:

a first-side first-polarity electrode structure which is electrically connected to a lower region than said optical absorption layer of said waveguide mesa structure from a first side of said waveguide mesa structure, and said first side being opposite to a second side, and said first and second sides being distanced in a direction perpendicular to an incident direction of an incident light; and a second-side first-polarity electrode structure which is electrically connected to said lower region than said optical absorption layer of said waveguide mesa structure from a second side of said waveguide mesa structure.

18. The semiconductor device as claimed in claim 1, further comprising:

a second-polarity electrode structure which is electrically connected to an upper region than said optical absorption layer of said waveguide mesa structure from a top of said waveguide mesa structure, and said second-polarity electrode structure including a heat radiator.

19. The semiconductor device as claimed in claim 18, wherein said heat radiator comprises a thick electrode layer made of a high heat conductivity.

20. The semiconductor device as claimed in claim 1, wherein said optical absorption layer receives a direct incidence of a light.

21. The semiconductor device as claimed in claim 1, wherein said waveguide mesa structure includes an optical guide region adjacent to said optical absorption layer, and said optical guide region receives a direct incidence of a light, so that said light is indirectly incident to said optical absorption layer through said optical guide region.

22. The semiconductor device as claimed in claim 21, wherein said optical guide region has a uniform refractive index and a uniform wavelength composition.

23. The semiconductor device as claimed in claim 21, wherein said optical guide region increases in refractive index uniform and wavelength composition toward said optical absorption layer.

24. The semiconductor device as claimed in claim 23, wherein said optical guide region comprises plural layers, and a closer one of said plural layers to said optical absorption layer is highest in refractive index uniform and wavelength composition.

25. The semiconductor device as claimed in claim 1, wherein said heat radiation semiconductor layer comprises an Fe-doped InP layer.

26. The semiconductor device as claimed in claim 7, wherein in said incident direction of said incident light, said second groove extends in almost the same extent, as an entirety of said waveguide mesa structure.

* * * * *